US009054589B2

(12) United States Patent
Cheng et al.

(10) Patent No.: US 9,054,589 B2
(45) **Date of Patent: *Jun. 9, 2015**

(54) METHOD AND APPARATUS FOR DETECTING POWER CONVERTER CAPACITOR DEGRADATION USING NEGATIVE SEQUENCE CURRENTS

(71) Applicant: Rockwell Automation Technologies, Inc., Mayfield Heights, OH (US)

(72) Inventors: Zhongyuan Cheng, Cambridge (CA); Yuan Xiao, Kitchener (CA); Ghodratollah Esmaeili Rineh, West Vancouver (CA); Manish Pande, Cambrdige (CA); Navid Zargari, Cambridge (CA)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 327 days.

This patent is subject to a terminal disclaimer.

(21) Appl. No.: 13/650,891

(22) Filed: Oct. 12, 2012

(65) Prior Publication Data

US 2013/0057297 A1 Mar. 7, 2013

Related U.S. Application Data

(63) Continuation-in-part of application No. 13/532,906, filed on Jun. 26, 2012, now Pat. No. 8,937,796, which is a continuation of application No. 12/789,853, filed on May 28, 2010, now Pat. No. 8,259,426.

(51) Int. Cl.
*H02H 3/00* (2006.01)
*H02M 1/32* (2007.01)

(Continued)

(52) U.S. Cl.
CPC ................ *H02M 1/32* (2013.01); *H02M 5/451* (2013.01); *H02M 5/458* (2013.01); *H02M 5/4585* (2013.01); *H02M 7/525* (2013.01);

(Continued)

(58) Field of Classification Search
CPC ..................................................... H02M 7/525
USPC ........................................................... 361/88
See application file for complete search history.

(56) References Cited

U.S. PATENT DOCUMENTS

| | | | |
|---|---|---|---|
| 5,319,513 | A | 6/1994 | Lowenstein et al. |
| 5,796,258 | A | 8/1998 | Yang |

(Continued)

OTHER PUBLICATIONS

U.S. Appl. No. 13/570,781, "Filter Capacitor Degradation Detection Apparatus and Method", by Patel et al., filed Aug. 9, 2012.

(Continued)

*Primary Examiner* — Stephen W Jackson
(74) *Attorney, Agent, or Firm* — Fay Sharpe LLP

(57) ABSTRACT

Power converters and control techniques are presented in which capacitor degradation is detected according to negative sequence current by computing an uncompensated negative sequence current and a negative sequence voltage, compensating the negative sequence current based on the negative sequence voltage, comparing the compensated or uncompensated negative sequence current with an automatically calculated threshold and selectively identifying suspected degradation of one or more capacitors if the compensated negative sequence current exceeds the threshold value. The method can be used for power converters, control devices or protection relays for shunt capacitors or filters used in power systems.

21 Claims, 16 Drawing Sheets

(51) Int. Cl.

| | |
|---|---|
| ***H02M 5/451*** | (2006.01) |
| ***H02M 5/458*** | (2006.01) |
| ***H02M 7/525*** | (2006.01) |
| ***H02M 7/539*** | (2006.01) |
| ***G01R 31/02*** | (2006.01) |
| *G01R 31/42* | (2006.01) |

(52) U.S. Cl.
CPC .............. *H02M 7/539* (2013.01); *G01R 31/42* (2013.01); *G01R 31/028* (2013.01)

(56) References Cited

U.S. PATENT DOCUMENTS

| | | | |
|---|---|---|---|
| 6,166,929 | A | 12/2000 | Ma et al. |
| 6,269,010 | B1 | 7/2001 | Ma et al. |
| 6,366,483 | B1 | 4/2002 | Ma et al. |
| 6,525,951 | B1 | 2/2003 | Paice |
| 6,642,689 | B2 | 11/2003 | Ishida et al. |
| 7,274,576 | B1 | 9/2007 | Zargari et al. |
| 7,495,410 | B2 | 2/2009 | Zargari et al. |
| 7,495,938 | B2 | 2/2009 | Wu et al. |
| 7,511,976 | B2 | 3/2009 | Zargari et al. |
| 7,616,005 | B2 | 11/2009 | Kalyuzhny et al. |
| 7,683,568 | B2 | 3/2010 | Pande et al. |
| 7,764,523 | B2 | 7/2010 | Conticelli et al. |
| 7,782,009 | B2 | 8/2010 | Wiseman |
| 7,786,735 | B2 | 8/2010 | Kalyuzhny et al. |
| 7,812,615 | B2 | 10/2010 | Gajic et al. |
| 8,009,450 | B2 | 8/2011 | Royak et al. |
| 8,044,631 | B2 | 10/2011 | Dai et al. |
| 8,259,480 | B2 * | 9/2012 | Hasler ........................... 363/137 |
| 8,350,397 | B2 | 1/2013 | Lang et al. |
| 8,395,910 | B2 | 3/2013 | Alexander |
| 8,400,800 | B2 | 3/2013 | Alexander |
| 8,587,160 | B2 | 11/2013 | Dai et al. |
| 8,729,844 | B2 | 5/2014 | Feng et al. |
| 2007/0211501 | A1 | 9/2007 | Zargari et al. |
| 2007/0297202 | A1 | 12/2007 | Zargari et al. |
| 2008/0180055 | A1 | 7/2008 | Zargari et al. |
| 2009/0128083 | A1 | 5/2009 | Zargari |
| 2010/0025995 | A1 | 2/2010 | Lang et al. |
| 2010/0080028 | A1 | 4/2010 | Cheng et al. |
| 2011/0292696 | A1 | 12/2011 | Xiao et al. |
| 2012/0271572 | A1 | 10/2012 | Xiao |
| 2013/0286692 | A1 | 10/2013 | Patel et al. |

OTHER PUBLICATIONS

ABB Bay Control REC670 Application manual, Relion 670 series, http://www05./abb.com/global/scot/scot354.nsf, Oct. 10, 2011, pp. 1-586.

Transformer protection RET670 ANSI Application manual, Relion 670 series, http://www.abb.com/product/db0003db004281/c12573e700330419c/257f000263ad5.aspx#!, May 6, 2011, pp. 1-864.

“Protective Relays”, iCP-630 Capacitor Bank Protection Relay, Cooper Power Systems, Jan. 2011, pp. 1-8.

ABB Distribution Automation Handbook, Section 8.10 Protection of Capacitor Banks, Mar. 5, 2011.

GE C70 Capacitor Bank Protection and Control System UR Series Instruction Manual C70 Revision: 6.0x, Copyright @ 2011, GE Multilin, http://www.GEmultilin.com, pp. 1-644.

“iCP-630 Capacitor Bank Protection Relay”, Cooper Power Systems, Mar. 2007.

* cited by examiner

METHOD AND APPARATUS FOR DETECTING POWER CONVERTER CAPACITOR DEGRADATION USING NEGATIVE SEQUENCE CURRENTS

REFERENCE TO RELATED APPLICATION

This application is a continuation-in-part of and claims priority to and the benefit of U.S. patent application Ser. No. 13/532,906, filed on Jun. 26, 2012, entitled VARIABLE FREQUENCY DRIVE AND METHODS FOR FILTER CAPACITOR FAULT DETECTION, which is a continuation of and claims priority to and the benefit of U.S. patent application Ser. No. 12/789,853, filed on May 28, 2010, now U.S. Pat. No. 8,259,426, issued Sep. 4, 2012 and entitled VARIABLE FREQUENCY DRIVE AND METHODS FOR FILTER CAPACITOR FAULT DETECTION, the entirety of which applications are hereby incorporated by reference.

BACKGROUND

The present disclosure relates generally to electrical power equipment for example power conversion systems and more particularly to techniques for detecting degradation in multiphase power capacitors. Motor drives and other electric power conversion systems convert input power from a line-side source to a different form to provide controlled drive currents to the windings of an electric motor or other load, where the output frequency is variable. Variable Frequency Drives (VFDs) typically include a passive or active rectifier with AC input power being rectified to create DC link power in an intermediate DC circuit. The intermediate DC power is fed to an output inverter which creates a variable frequency single or multi-phase AC output driving a motor load at a controlled speed and torque. VFDs often include filter circuits at the power input and/or load output, including capacitors. Capacitor degradation or other fault conditions in the capacitors can adversely affect the power converter operation. Previous systems employed pressure relays to detect change in pressure inside the capacitor, but such techniques require extra components and increase the size, cost, and complexity of motor drives. Moreover, detecting degradation of a first degrading element is important for taking action prior to device failure. At the same time, however, it is desirable to avoid nuisance alarms associated with system voltage unbalance and/or system transient/harmonic conditions as opposed to actual capacitor degradation. In this regard, conventional techniques are not universally applicable in all system grounding configurations, and thus may work reliably in some systems and not in others. Thus, there is a need for improved apparatus and techniques by which the adverse effects of capacitor degradation can be avoided or mitigated by detecting degrading capacitor conditions without adding to the system size, cost and complexity.

SUMMARY

Various aspects of the present disclosure are now summarized to facilitate a basic understanding of the disclosure, wherein this summary is not an extensive overview of the disclosure, and is intended neither to identify certain elements of the disclosure, nor to delineate the scope thereof. Rather, the primary purpose of this summary is to present some concepts of the disclosure in a simplified form prior to the more detailed description that is presented hereinafter. The present disclosure provides methods and apparatus for detecting capacitor degradation using negative sequence currents.

The disclosed concepts may be advantageously employed to facilitate early detection of capacitor degradation without requiring additional sensors in motor drives and other power systems involving multiphase power capacitors.

Power conversion systems are provided, which include a filter circuit having multiple capacitors coupled with an AC input or output, as well as a controller that identifies suspected capacitor degradation based at least partially on a negative sequence current associated with the filter circuit. In certain embodiments, the controller computes an uncompensated negative sequence current value based at least partially on signals or values representing AC input or output currents, and identifies suspected degradation based at least partially on the uncompensated negative sequence current value. In certain embodiments, moreover, the controller compensates the negative sequence current value based at least partially on voltage signals or values to obtain a compensated negative sequence current value, and identifies suspected capacitor degradation based at least partially on the compensated negative sequence current value. In certain embodiments, the uncompensated negative sequence current value is computed based on current signals or values representing fewer than all of the AC currents associated with the power converter AC input or AC output. In certain embodiments, the controller computes a negative sequence voltage value based on voltage signals or values representing fewer than all of the AC voltages associated with the AC input or the AC output.

Methods and non-transitory computer readable mediums are provided with computer executable instructions for identifying suspected capacitor degradation in a power conversion system. The method includes computing an uncompensated negative sequence current value based on AC currents associated with a power converter input or output, compensating the uncompensated negative sequence current value based at least partially on signals or values representing AC voltages associated with the converter input or output, and identifying suspected capacitor degradation at least partially according to the compensated negative sequence current value.

BRIEF DESCRIPTION OF THE DRAWINGS

The following description and drawings set forth certain illustrative implementations of the disclosure in detail, which are indicative of several exemplary ways in which the various principles of the disclosure may be carried out. The illustrated examples, however, are not exhaustive of the many possible embodiments of the disclosure. Other objects, advantages and novel features of the disclosure will be set forth in the following detailed description when considered in conjunction with the drawings, in which.

DETAILED DESCRIPTION

Figure 1:
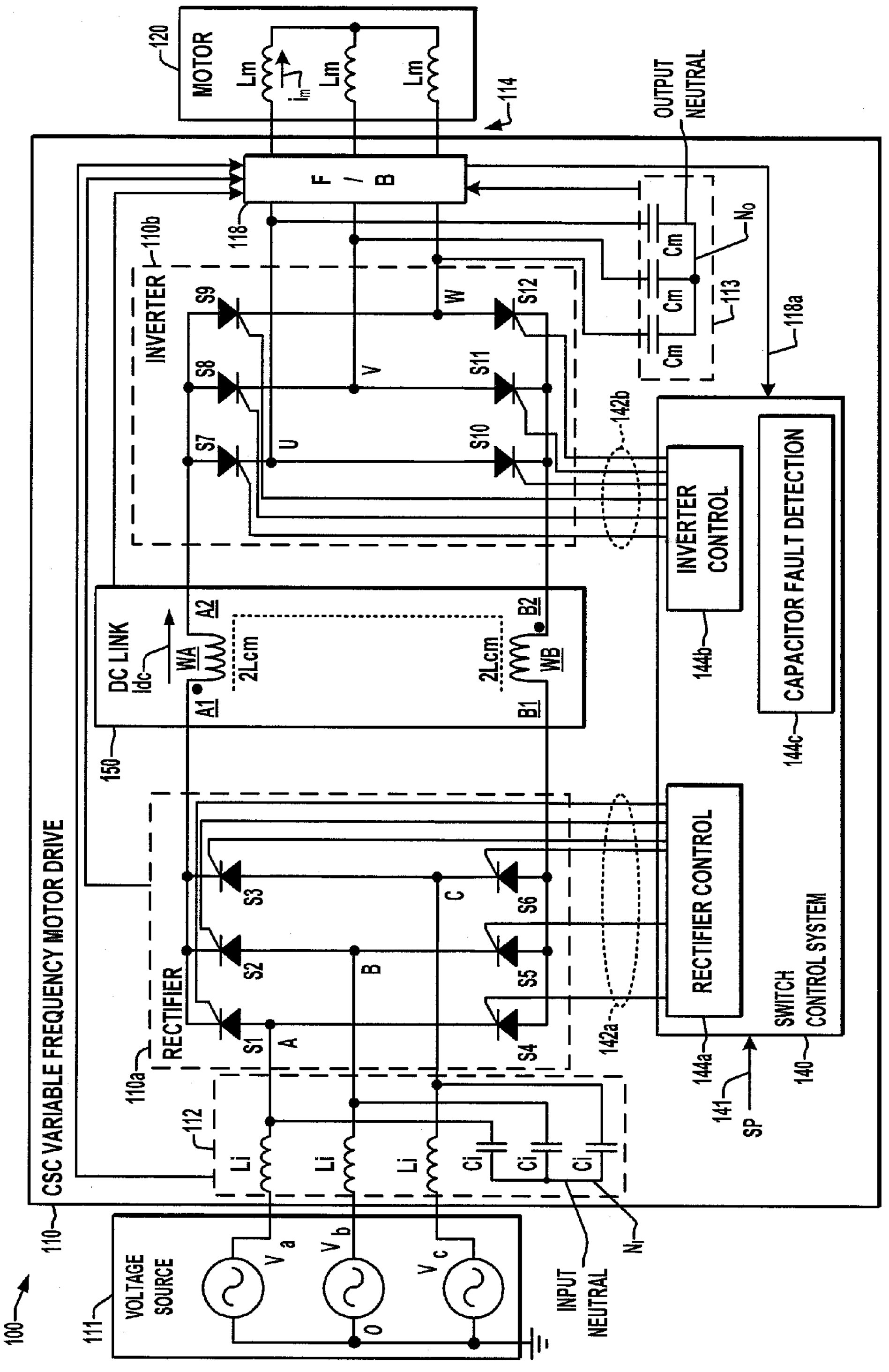
FIG. 1 is a schematic diagram illustrating an exemplary current source converter variable frequency motor drive with a capacitor fault detection component.

Referring now to the figures, several embodiments or implementations are hereinafter described in conjunction with the drawings, wherein like reference numerals are used to refer to like elements throughout, and wherein the various features are not necessarily drawn to scale. The disclosure presents several techniques and apparatus for detection of capacitor degradation, which may be employed in association with any form of control devices or protection relays for power factor correction (PFC) system, power filtering system or power conversion system, including without limitation motor drives. Faults and degradation of capacitors as used herein are inclusive of decreased performance up to and including component failures.

Several exemplary embodiments are illustrated and described below in the context of three-phase AC motor drives, although the various disclosed concepts find utility in connection with any single or multiphase configuration with three or more phases of input and/or output power, in which the health of input and/or output filter circuitry can be assessed to detect suspected capacitor degradation. These techniques and apparatus, moreover, may be employed for any configuration of capacitors alone and/or in combination with one or more inductances and/or resistors with respect to a bank of capacitors forming an input or output filter circuit, power factor correction circuit, power device switching commutation circuit, multiphase LC filter circuits for power converter input and/or output stages, and/or for multiphase CL filter or LCL filter circuits associated with an AC input or AC output of a power conversion system, and/or other forms of second order or higher order filters involving capacitors as a filtering component. In addition, several exemplary techniques are disclosed for identifying suspected capacitor degradation based at least in part on negative sequence currents which can be employed in association with filter circuits having any suitable grounding configuration, including without limitation filter circuits that are ungrounded, impedance grounded and/or directly grounded, etc., whether the capacitors are connected in a Δ configuration, a "Y" configuration, or other capacitor interconnection topology. The capacitors may also be other L/R/C combinations having capacitive impedance at power system frequency. In addition, the disclosed concepts may be used for detection of degradation for capacitors that are single devices or capacitor banks which are formed from a plurality of component capacitors or combinations thereof, whether connected in series, parallel or series/parallel combinations with or without damping/bleeding resistors, tuning inductors and/or other auxiliary devices.

FIGS. 1-12 illustrate techniques for identifying a capacitor degradation through detection of current or voltage unbalance in the fundamental frequency component (e.g., 60 Hz in the US, 50 Hz for Europe, etc.), such as by comparing measured neutral fundamental component with a no-fault fundamental component value. The inventors have appreciated that unlike utility type power converters, variable frequency motor drives provide output voltages and currents at a variety of frequencies, due to the variable frequency nature of the output as well as the switching operation of the inverter and active rectifiers. Simple measurement of neutral voltages or currents in these drives does not allow reliable identification of fault conditions, since the neutral signals have a variety of distinct frequency components that change during operation. For example, in certain embodiments of the presently disclosed techniques, a 60 Hz fundamental frequency component of the capacitor neutral voltage/current is extracted from a signal which also includes a 180 Hz component and high frequency components. The detection of suspected capacitor fault conditions can then be indicated to a user or automatic remedial actions can be taken for controlled shutdown or other safe operation of the VFD. This facilitates early detection to minimize the occurrence of capacitor failures. The disclosed systems and techniques, moreover, can be implemented using sensed values also used for motor drive control, and thus no extra parts are needed. The disclosed concepts may also be used for harmonic filters, PFC shunt capacitors and other equipment involving power capacitors.

Referring initially to FIG. 1, a power conversion system 100 is shown, having a capacitor fault detection component 144*c* in accordance with certain aspects of the disclosure. The converter 100 includes an exemplary three-phase AC voltage source 111 providing input power to a variable frequency motor drive (VFD) 110 that converts the input power to drive a motor load 120 coupled to a converter output 114. The drive 110 in this embodiment is a current source converter (CSC) type, with an input 112 connected to the AC power source 111 (FIG. 11 below illustrates a voltage source converter embodiment). While these examples are illustrated as having a three phase input 112, other embodiments may provide a single phase AC input or may include a multiphase input adapted to receive three or more input phases.

The CSC drive 110 in FIG. 1 provides variable frequency, variable amplitude single or multiphase AC output power at output terminals 114 to drive an AC motor load 120, which has three phase windings in the illustrated example. The output 114 in other embodiments may provide a single phase AC output or may be of any number of phases. The motor drive 110 includes both input capacitors Ci in the input circuit 112, as well as output capacitors Cm. The input capacitors Ci are coupled between corresponding input phase lines A, B, and C and an input neutral node $N_I$. Output capacitors Cm are individually coupled between a corresponding output phase line U, V, and W and an output neutral node $N_O$. Certain embodiments may omit either of the input or output capacitor sets. The input and output neutral nodes $N_I$, $N_O$ may be floating in certain embodiments, or one or both of the neutrals $N_I$, $N_O$ may be coupled to the ground of the input power source or to another ground. In still other possible embodiments, the neutrals $N_I$, $N_O$ may be coupled to one another without reference to any system ground, or may be coupled to a point with defined electrical potential for example the mid point of the DC link directly or through an impedance in VSI converters.

The drive 110 includes a rectifier **110*a* receiving the AC input power from the source 111 via an input 112, as well as an intermediate DC circuit 150 with a DC link choke having upper and lower windings WA and WB coupled between the rectifier 110*a* and an output inverter 110*b*. In certain embodiments, the DC link could be a simple DC link inductor or a common mode choke as in the illustrated example. The illustrated drive 110, moreover, provides input filtering including inductors Li in each input phase and input capacitors Ci coupled between the input lines A, B, C, and the input neutral node $N_I$. The rectifier 110*a* in the embodiment of FIG. 1 is a current source rectifier (CSR) coupled with a current source inverter (CSI) 110*b* by the intermediate DC circuit 150, and one or more isolation components (e.g., transformers, not shown) may optionally be included in the drive 110. The output 114 provides output electrical power to the motor load 120 via lines U, V, and W, and includes a filter circuit 113 with the output capacitors Cm coupled between the load 120 and the output neutral node $N_O$. The input filter and output filter in FIG. 1** may also include some damping factors for example resistors, and/or auxiliary tuning inductors connected in series or in parallel with the capacitors.

The rectifier **110*a* in certain embodiments may be a passive rectifier with rectifier diodes. In the illustrated embodiment, the rectifier 110*a* is an active switching rectifier with switching devices S1-S6 coupled between the input 112 and the DC circuit 150 and operates according to a plurality of rectifier switching control signals 142*a* provided by a rectifier control component 144*a* of a switch control system 140. In operation, the AC input power is switched by the rectifier switches S1-S6 to create an intermediate DC bus current Idc in the intermediate circuit 150. The inverter 110*b* includes switching devices S7-S12 coupled between the DC circuit 150 and lines U, V, and W of the output 114. The inverter switches S7-S12 are operated according to corresponding switching control signals from an inverter control component 144*b* of the switch control system 140 to selectively convert DC power from the DC circuit 150 to provide the AC output power to drive the motor load 120. The DC link choke or inductor links the switches of the rectifier 110*a* and the inverter 110*b*, and provides forward and return current paths therebetween. The first winding WA in a forward or positive DC path of the link choke has a first end A1 connected to the upper rectifier switches S1-S3 and a second end A2 coupled with the upper inverter switches S7-S9, and the second winding WB in a negative or return DC path has a first end B1 coupled to the lower rectifier switches S4-S6 and a second end B2 coupled to the lower inverter switches S10-S12**.

The rectifier and inverter switching devices S1-S12 may be any suitable controllable electrical switch types (e.g., IGCTs, GTOs, thyristors, IGBTs, etc.) that are controlled according to any suitable type or form of switching scheme or schemes, such as phase control, pulse width modulation, etc., in open or closed-loop fashion. In certain embodiments, the switching devices S7-S12 of the inverter **110*b* are forced commutated devices including without limitation SGCTs, IGBTs or GTOs, and the switching devices S1-S6 of the rectifier 110*a* can be force commutated devices such as those mentioned above as well as line commutated devices such as Thyristors. In this regard, Thyristor devices could be used for the inverter switching devices S7-S12** in the form of forced commutated devices with extra circuitry added to the device triggering circuit thereof.

The rectifier **110*a* and the inverter 110*b* operate under control of a switch control system 140 comprised of one or more processors and associated memory as well as I/O circuits including driver circuitry for generating switching control signals 142 to selectively actuate the switching devices, although separate switching control systems may be employed, for example, with interconnections and information sharing to facilitate the coordinated operation of the rectifier 110*a* and the inverter 110*b*. The switch control system 140 in these embodiments includes an inverter control component 144*b* providing the inverter switching control signals 142*b* to cause the inverter 110*b* to selectively convert DC current from the DC circuit 150 to provide AC electrical power to the AC output 114 according to one or more setpoints 141, such as desired motor speed, torque, etc. The switch control system 140 and the components 144 thereof can be implemented as any suitable hardware, processor-executed software, processor-executed firmware, programmable logic, or combinations thereof, operative as any suitable controller or regulator by which the motor 120** is controlled according to one or more desired profile(s) or setpoint(s) in open or closed-loop fashion.

In operation, moreover, a rectifier control component **144*a* of the controller 140 provides the rectifier switching control signals 142*a* to convert AC electrical input power to provide a regulated DC current Idc to the DC circuit 150. In doing so, the rectifier controller 144*a* may employ one or more feedback signals or values 118*a*, such as a measured DC current value from the rectifier 110*a* representing the actual DC current Idc. The DC link current provided by the rectifier 110*a* thus provides input current for conversion by the inverter 110*b*, where the exemplary inverter control 144*b* provides a desired DC link current signal or value as a setpoint to the rectifier controller 144*a*. In this manner, the rectifier 110*a* provides the DC current required by the inverter 110*b*, and the rectifier controller 144*a* may also implement other control functions such as power factor correction, while the inverter controller 144*b* performs the necessary motor control operation of the drive 110**.

The drive 110 also includes a feedback system 118 operatively coupled with the input 112, the rectifier **110*a*, the DC circuit 150, the inverter 110*b*, the output filter circuit 113, and the output 114. The feedback system 118 includes one or more sensing elements operative to provide one or more feedback signals and/or values 118*a* indicative of electrical conditions at the input 112, the rectifier 110*a*, the intermediate DC circuit 150, the inverter 110***b*, the output filter 113, and/or at the output 114. The switch control system 140 may be provided with one or more setpoints or desired values 141 and one or more feedback signals or values 118*a* from the feedback system 118 by which one or more closed loop motor drive control goals are achieved in normal operation.

Feedback signals or values for the control functions can be based on signals and/or values 118*a* from the feedback system 118, measured input values, (e.g., line voltages, currents, etc.), and other information, data, etc., which may be in any suitable form such as an electrical signal, digital data, etc., and which may be received from any suitable source, such as an external network, switches, a user interface associated with the system 100, or other suitable source(s). The feedback circuit 118 provides feedback signal(s) or value(s) to the controller 140 from at least one of the rectifier 110*a*, the DC circuit 150, and the inverter 110*b*, including measured motor speed values through appropriate tachometers or other sensors, and/or sensed values from which motor speed, torque, current, and/or voltage, etc. may be determined by the controller 140. In this regard, sensorless motor speed feedback values may be generated internally by the controller 140 via suitable motor models based on the feedback signals or values 118*a* even for systems having no direct motor speed measurement sensors.

In the illustrated embodiments, moreover, the feedback circuit 118 also provides one or more feedback signals or values 118*a* to the capacitor fault detection component of the controller 140 based on a sensed condition of one or both of the neutral nodes $N_I$ and/or $N_O$. In various embodiments, feedback conditions are sensed at either or both of the neutral nodes $N_I$ and/or $N_O$, and at either or both of these nodes, such neutral feedback signal or value 118*a* can be based on a sensed voltage of the neutral node $N_I$, $N_O$, and/or a sensed current of the neutral node $N_I$, $N_O$.

Figure 2:
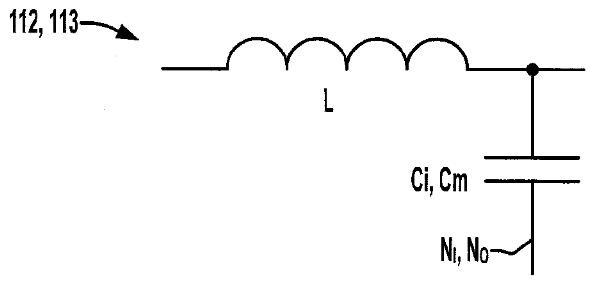
FIGS. 2-4 are schematic diagrams illustrating several exemplary capacitor configurations for VFDs.
Figure 3:
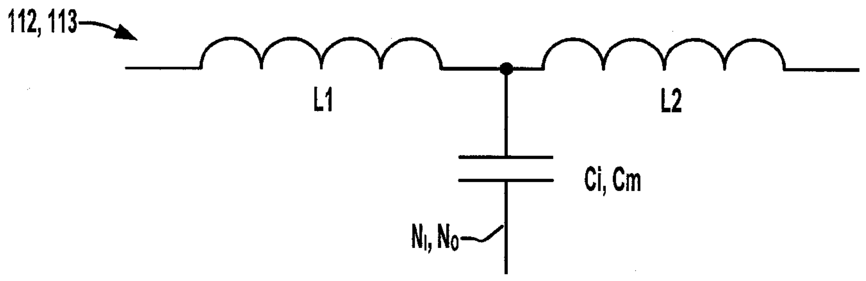
Figure 4:
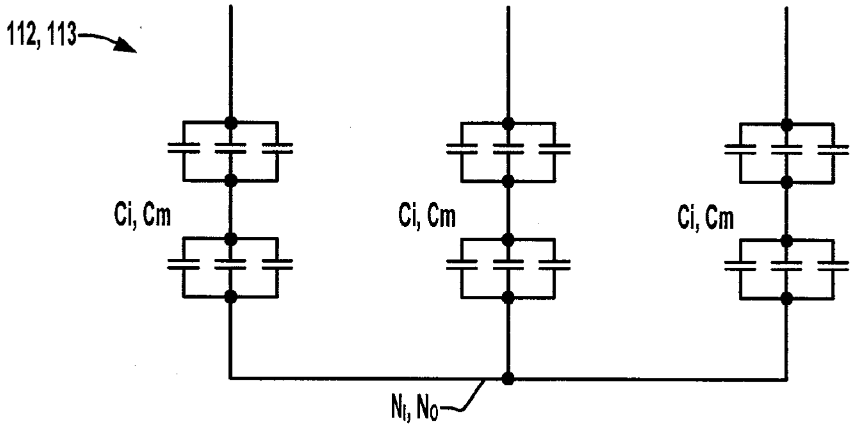
Figure 5:
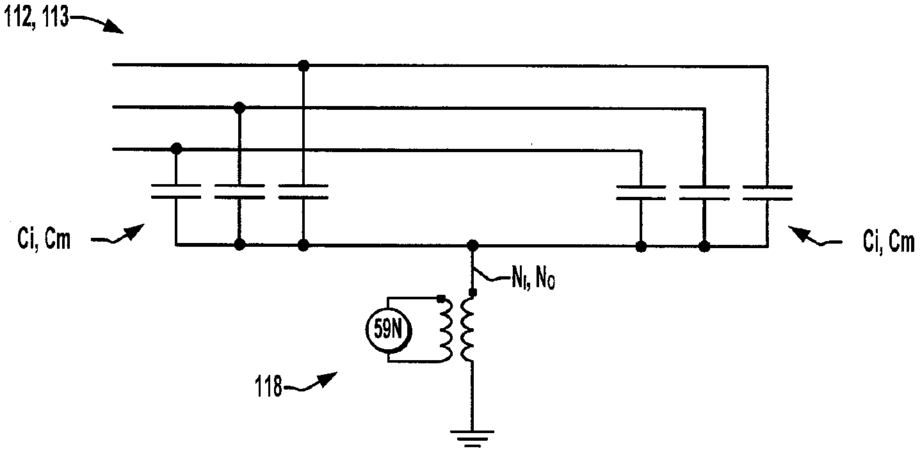
FIGS. 5 and 6 are schematic diagrams illustrating exemplary neutral current and neutral voltage sensing circuits.
Figure 6:
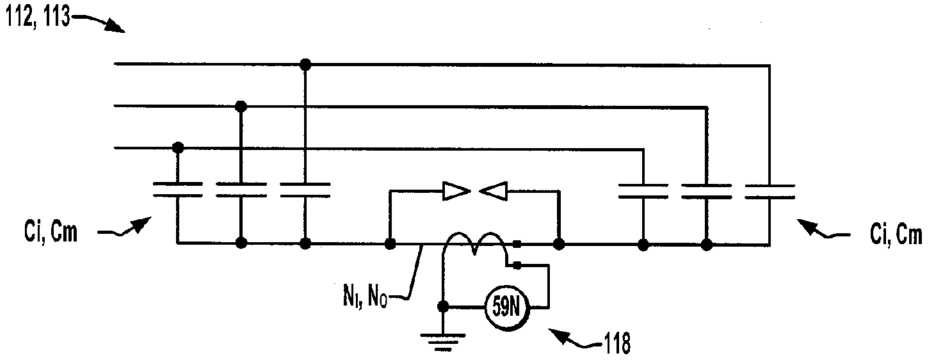

Referring also to FIGS. 2-6, FIGS. 2-4 show several exemplary capacitor configurations in which capacitors Ci, Cm can be connected to a neutral node $N_I$, $N_O$, whether alone or in combination with other filtering components, such as inductances L, L1, L2 in FIGS. 2 and 3. There may be other auxiliary components involved in the circuit such as damping/bleeding resistors, or additional tuning inductors connected in parallel or in series with the capacitors. Moreover, as shown in FIG. 4, the capacitances Ci, Cm can individually be implemented as two or more capacitor devices. In addition, any suitable neutral node condition sensing configurations and sensor apparatus may be used, examples of which are shown in FIGS. 5 and 6. The feedback circuitry 118 in FIG. 5 includes an exemplary sensor for sensing the voltage of the neutral node $N_I$, $N_O$ with respect to ground. FIG. 6 illustrates an exemplary sensor of the feedback system 118 operative to sense current in the neutral node $N_I$, $N_O$.

Figure 7:
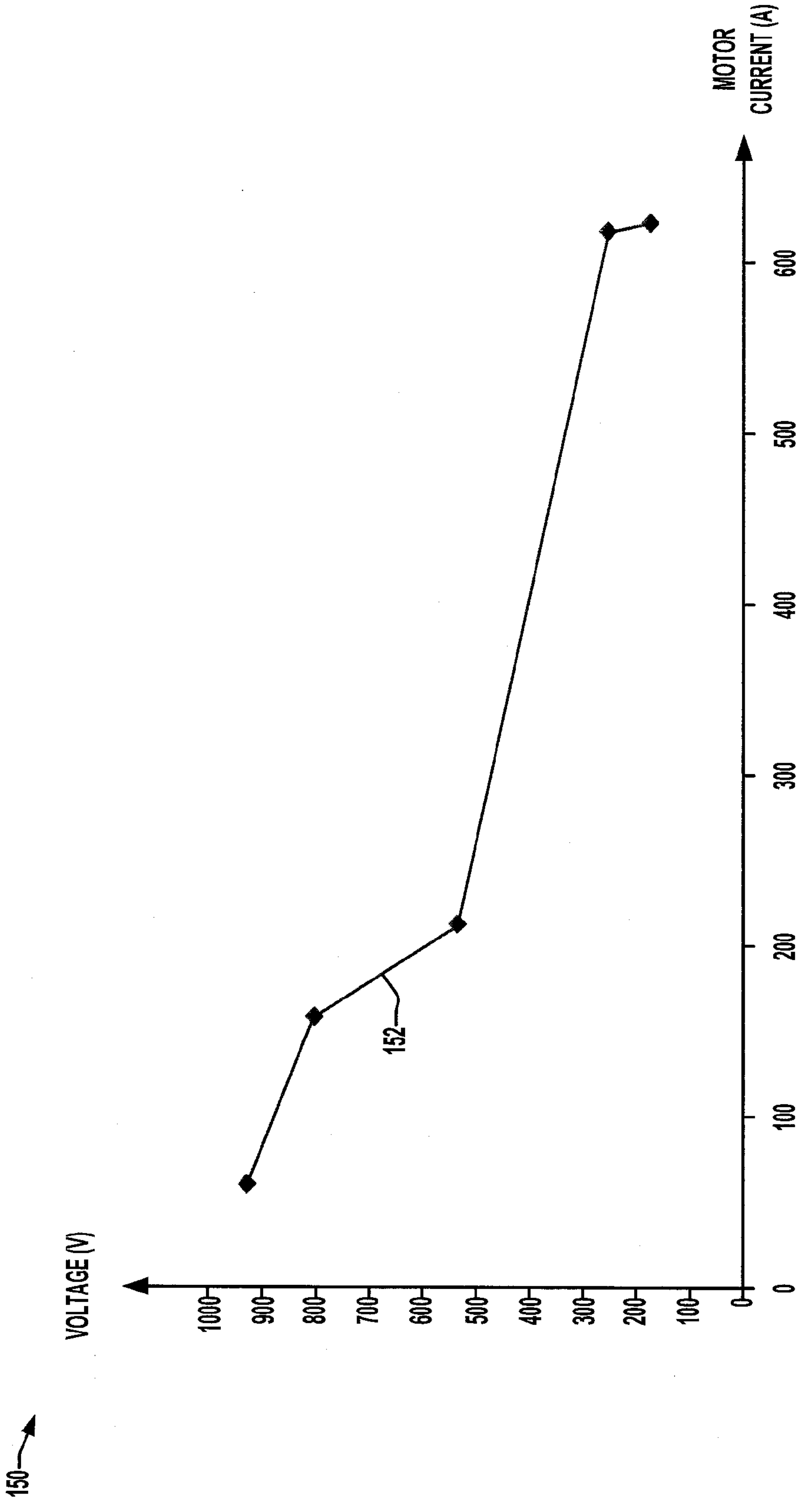
FIG. 7 is a graph illustrating change in a fundamental frequency component of a neutral-to-ground voltage in a VFD.
Figure 8:
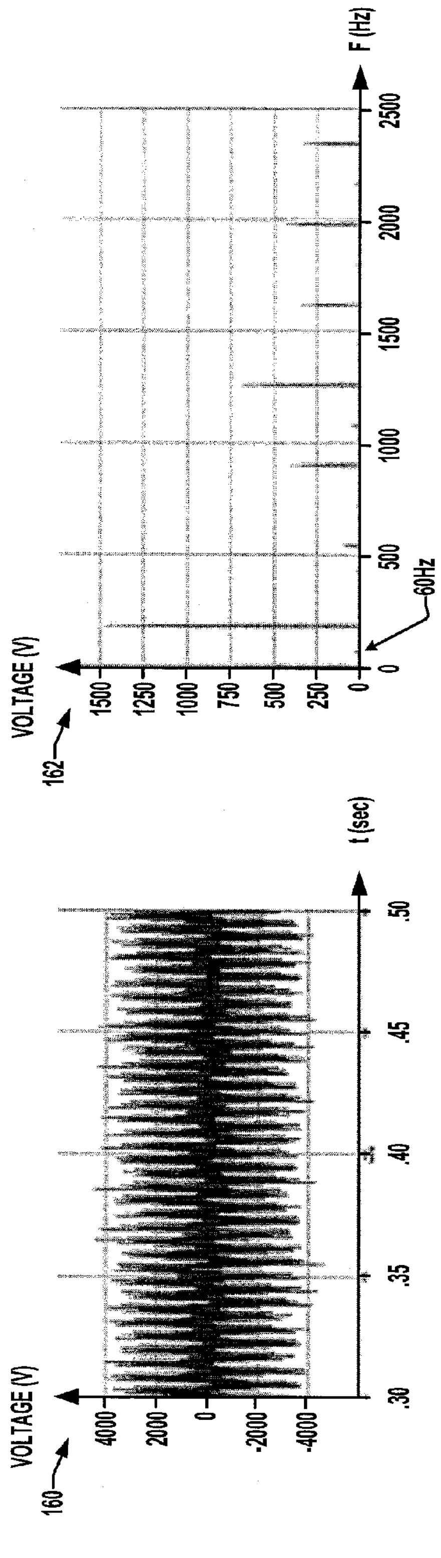
FIGS. 8 and 9 are composite time domain and frequency domain graphs illustrating change in a fundamental frequency component of a neutral-to-ground voltage in a VFD.
Figure 9:
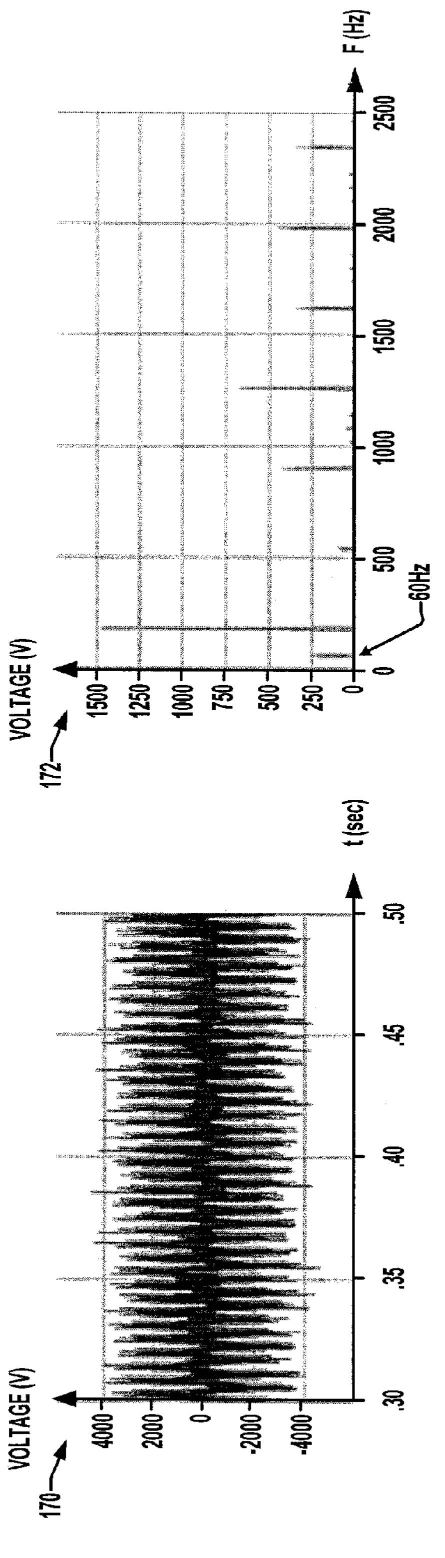

Referring also to FIGS. 7-9, a graph 150 in FIG. 7 illustrates a curve 152 showing change in a fundamental frequency component of a neutral-to-ground voltage in a variable frequency motor drive as a function of current. FIGS. 8 and 9 are composite time domain and frequency domain graphs 160, 162, 170, and 172 showing the change in a 60 Hz fundamental frequency component of a neutral-to-ground voltage in the drive for normal (no-fault) and faulted capacitor situations. A no-fault condition is shown in FIG. 8, where graph 160 depicts a time domain neutral-to-ground voltage waveform having a variety of different frequency components, and graph 162 shows a corresponding frequency domain plot of the different frequency components, including a fundamental component at 60 Hz (for a 60 Hz input power source frequency). FIG. 9 illustrates corresponding time and frequency domain graphs 170 and 172 for the neutral-to-ground voltage when a fault condition occurs in one or more input and/or output capacitors Ci, Cm. In this example, it is seen that the fundamental 60 Hz component in the graph 172 of FIG. 9 is higher than in the graph 162 of FIG. 8.

Table 1 below includes several exemplary neutral-to-ground voltage fundamental frequency component values $FC_{NO\text{-}FAULT}$ and $FC_{MEASURED}$ (e.g., at 60 Hz) for both no-fault and capacitor fault conditions, at different motor output current levels for each of four exemplary variable frequency drive 110 configurations (direct to drive (D2D) with neutral grounded, D2D with neutral floating, Dc link grounded, and Dc link floating):

TABLE 1

| | Amps | Fundamental component $FC_{NO\text{-}FAULT}$ of Vn-g line side no-fault | Fundamental component $FC_{MEASURED}$ of Vn-g line post-fault | Current unbalance (%) |
|---|---|---|---|---|
| D2D grounded | 61 | 0 | 927 | 16.78% |
| | 160 | 0 | 803 | 7.50% |
| | 215 | 0 | 535 | 4.61% |
| | 625 | 0 | 256 | 2.65% |
| | 630 | 0 | 177 | 2.50% |
| D2D floating | 61 | 0 | 185 | 16.12% |
| | 160 | 0 | 146 | 8.42% |
| | 215 | 0 | 95 | 4.79% |
| | 625 | 0 | 57 | 3.19% |
| | 630 | 0 | 39 | 3.00% |
| DC link grounded | 61 | 0 | 917 | 15.80% |
| | 160 | 0 | 876 | 9.63% |
| | 215 | 0 | 455 | 4.32% |
| | 625 | 0 | 258 | 3.73% |
| DC link floating | 61 | 2.38 | 922 | 15.70% |
| | 160 | 30.8 | 664 | 9.40% |
| | 215 | 26 | 376 | 4.51% |
| | 625 | 25.7 | 257 | 3.69% |

As seen in the above Table 1, the no-fault value of the neutral-to-ground voltage fundamental frequency component $FC_{NO\text{-}FAULT}$ may be zero or may have a non-zero value, and the fault condition causes a discernible change in the measured fundamental frequency component $FC_{MEASURED}$.

Figure 10:
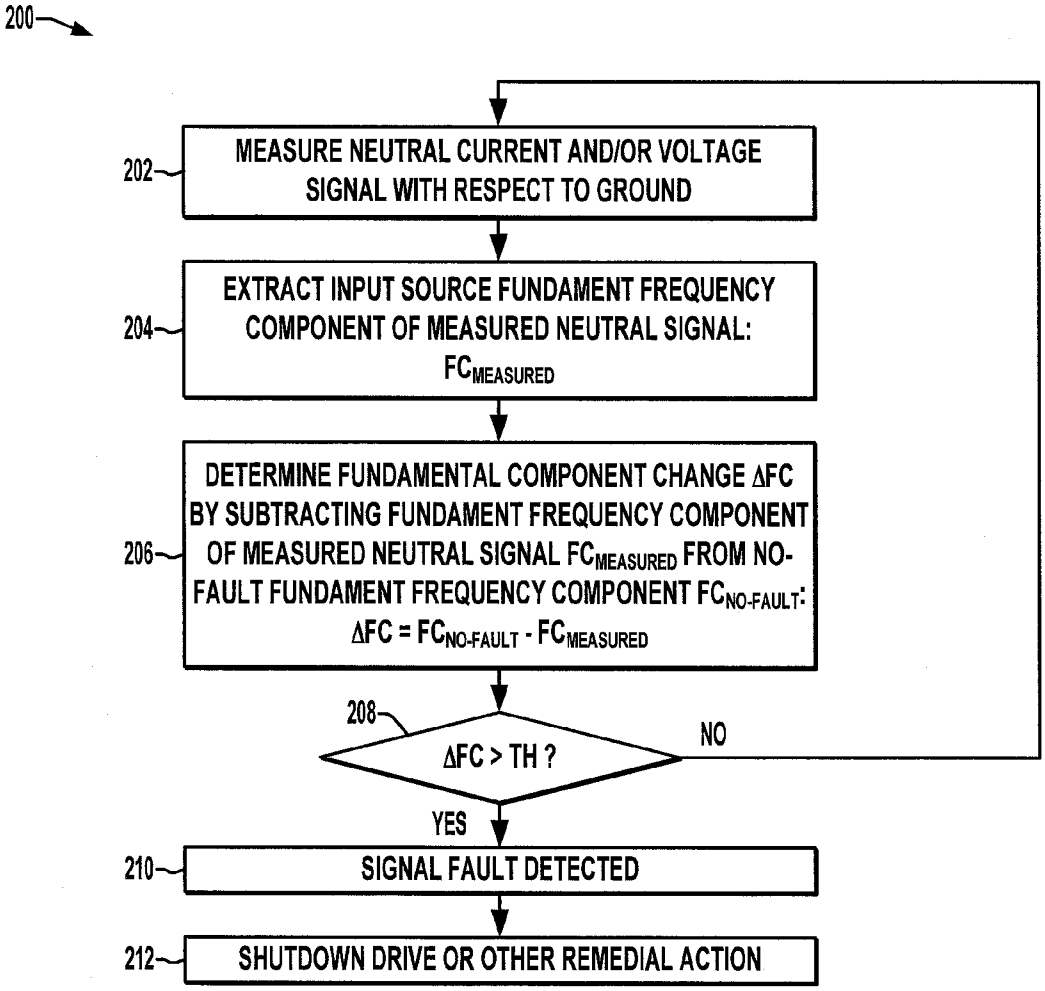
FIG. 10 is a flow diagram illustrating an exemplary method for operating a VFD motor drive.

Referring to FIGS. 1 and 10, the capacitor fault detection component 144*c* (FIG. 1) uses this concept to detect whether a capacitor fault is suspected in the drive 110. The capacitor fault detection circuit 144*c* in certain embodiments is implemented as part of the switch control system 140, but can be a separate processor-based system operatively associated with the drive 110 so as to receive at least one neutral feedback signal or value 118*a* from the feedback circuit 118. The fault detection component 144*c* in one embodiment operates generally according to an exemplary fault detection method 200 in FIG. 10. While the method 200 of FIG. 10 and the method 350 of FIG. 17 below are illustrated and described in the form of a series of acts or events, it will be appreciated that the various methods of the disclosure are not limited by the illustrated ordering of such acts or events. In this regard, except as specifically provided hereinafter, some acts or events may occur in different order and/or concurrently with other acts or events apart from those illustrated and described herein in accordance with the disclosure. It is further noted that not all illustrated steps may be required to implement a process or method in accordance with the present disclosure, and one or more such acts may be combined. The illustrated methods and other methods of the disclosure may be implemented in hardware, processor-executed software, or combinations thereof, in order to provide the capacitor fault (e.g., degradation) detection functionality described herein, and may be employed in any power conversion system including but not limited to the systems illustrated and described herein.

At 202 in FIG. 10, the feedback system 118 measures the neutral current and/or neutral voltage (e.g., neutral-to-ground voltage in one example) of one or both of the neutral nodes $N_I$, $N_O$. At 204, capacitor fault detection circuit 144*c* extracts a measured fundamental frequency component $FC_{MEASURED}$ from the neutral feedback signal(s) or value(s) 118*a* at a fundamental frequency of the AC electrical input power. In certain embodiments, the fundamental frequency component extraction at 204 includes performing digital filtering on the neutral feedback signal(s) or value(s) 118*a*. In certain embodiments, moreover, the capacitor fault detection circuit 144*c* may perform a fast Fourier transform (FFT) on one or more neutral feedback signal(s) or value(s) 118*a* at 204 to extract the measured fundamental frequency component $FC_{MEASURED}$.

At 206 and 208, the capacitor fault detection circuit 144*c* determines whether a fault condition is suspected in at least one of the capacitors Ci, Cm based at least partially on the measured fundamental frequency component $FC_{MEASURED}$ by any suitable technique. In one embodiment, the fault detection circuit 144*c* determines a fundamental component change value ΔFC at 206 by subtracting the measured fundamental frequency component $FC_{MEASURED}$ from a no-fault fundamental frequency component value $FC_{NO\text{-}FAULT}$ (e.g., using a corresponding table as shown above, which may be stored in memory of the controller 140). The fault detection circuit 144*c* in this example compares the fundamental component change value ΔFC to a threshold value TH at 208 and determines that a fault condition is suspected (YES at 208) in at least one of the capacitors Ci, Cm if the fundamental component change value ΔFC is greater that the threshold value TH. In one example, a threshold TH can be established at a suitable value less than the difference between the fault condition $FC_{MEASURED}$ values and the no-fault fundamental frequency component values $FC_{NO\text{-}FAULT}$ from the table above, and then used in detecting capacitor faults. If no fault is detected (NO at 208), the process repeats at 202-208 to continue monitoring the capacitor status. If a fault is detected, moreover, the fault detection circuit 144*c* in certain embodiments may signal detection of a fault at 210, for example, as a signal or message to the controller 140 or external system (not shown), and the fault detection circuit 144*c* and/or the controller 140 may thereupon shut the drive down or take other preprogrammed remedial action at 212.

In accordance with further aspects of the present disclosure, a non-transitory computer readable medium is provided, such as a computer memory, a memory within a power converter control system (e.g., switch control system 140 in FIGS. 1 and 11 above, a CD-ROM, floppy disk, flash drive, database, server, computer, etc.) which has computer executable instructions for performing the process steps of FIG. 10.

Figure 11:
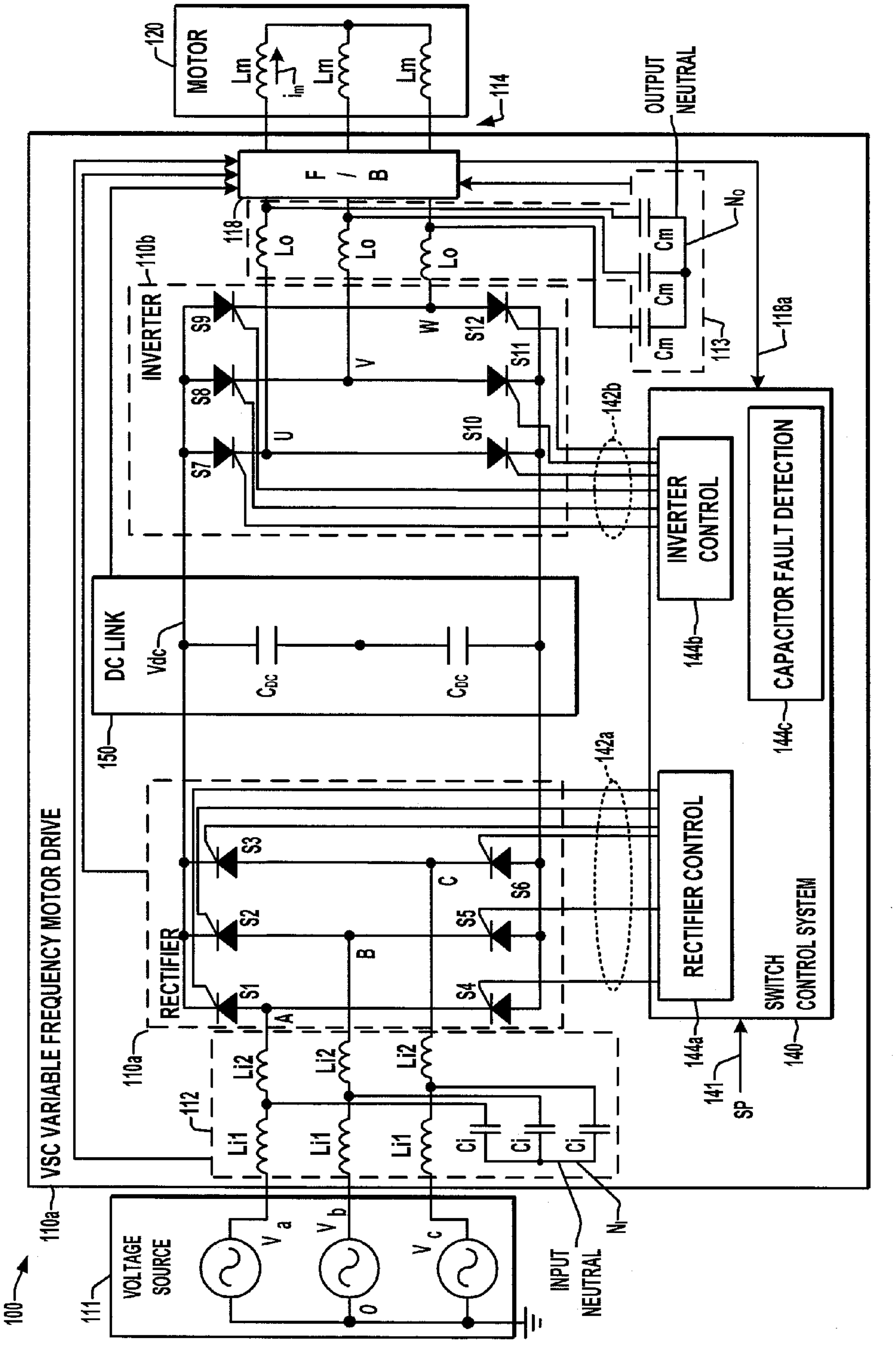
FIG. 11 is a schematic diagram illustrating a voltage source converter variable frequency motor drive with a capacitor fault detection component.

Referring also to FIG. 11, the fault detection circuit 144*c* and the above techniques can be implemented in voltage source converter (VSC) type variable frequency drives 110*a*, which operate generally as described above, with the intermediate DC link circuit 150 including one or more link capacitors $C_{DC}$ instead of a link choke. In this example, moreover, the input filter circuit 112 includes CL or LCL type filters (e.g., similar to FIG. 3 above) for each line with two inductors Li1 and Li2 in each line, and the output filter circuit 113 includes output inductors Lo connected in each output phase line in an LC filter configuration (e.g., FIG. 2).

Figure 12:
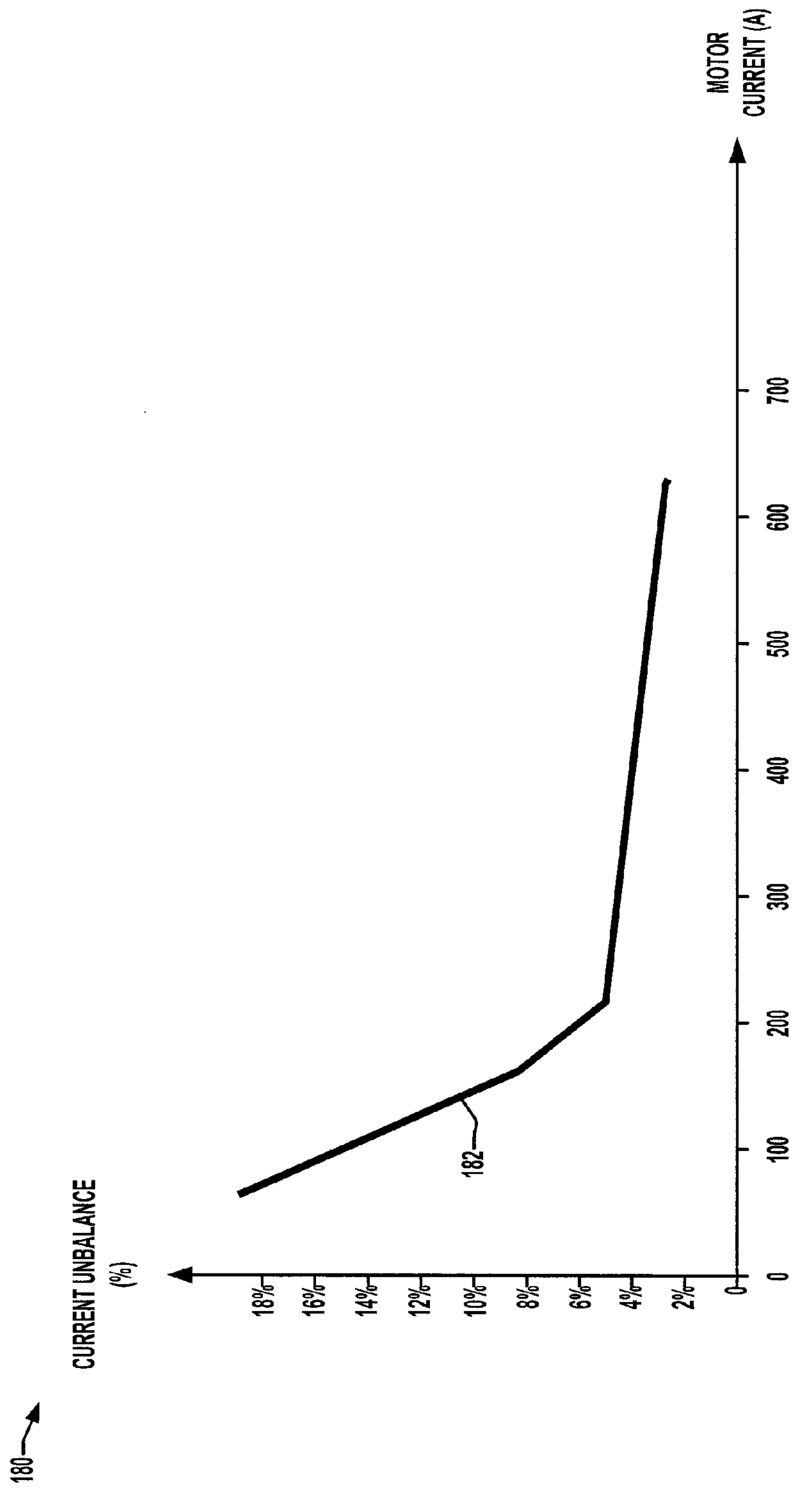
FIG. 12 is a graph illustrating change in current unbalance as a function of motor current in a D2D VFD.

Referring also to FIG. 12, a graph 180 illustrates a curve 182 showing percent current unbalance fault suspicion threshold values as a function of motor current in a D2D VFD. In accordance with certain embodiments of the disclosure, the capacitor fault detection circuit 144*c* or other component of the switch control system 140 monitors the VFD line currents from the input source 111, for example, based on one or more feedback signals 118*a* from the feedback system 118. The control system 140 calculates at least one input current unbalance value, for example, a percentage calculated according to all the monitored input phase line currents. The capacitor fault detection circuit 144*c* in certain embodiments determines whether a fault condition is suspected in at least one of the input capacitors Ci at least partially based on the input current unbalance value(s). In certain embodiments, the fault suspicion determination is based on both the measured fundamental frequency component $FC_{MEASURED}$ and the input current unbalance value(s). In other embodiments, either of these considerations can be used by the fault detection circuit 144*c* to determine whether a fault condition is suspected in at least one of the input capacitors Ci, for example by any suitable technique. In other embodiments, any or all of the measured neutral voltage(s) and/or current(s), the measured fundamental frequency component $FC_{MEASURED}$, and/or the input current unbalance value(s) can be used to determine whether a capacitor fault condition is suspected. As shown in the right-most column of Table 1 above, for instance, the fault detection circuit 144*c* compares the sensed unbalance (e.g., percentage in one example) to the fault unbalance threshold value (e.g., corresponding value of curve 182 in FIG. 12 or the value from Table 1, using interpolation as needed). In such embodiments, if the sensed current unbalance value exceeds the threshold, the fault detection circuit 144*c* determines that a fault condition is suspected in at least one of the input capacitors Ci. In this regard, under normal conditions, the unbalance will generally be zero, and when an input capacitor fault occurs, the unbalance level changes, and this change can be used by the controller 140 to detect suspected capacitor degradation.

Referring now to FIGS. 13-21, the inventors have further appreciated that negative sequence current flow in the input and/or output of a power conversion system 110 may be advantageously employed to assess capacitor degradation without the need for additional current transformers (CTs) or other sensors associated with neutral connections. Moreover, the inventors have appreciated that these techniques may be used in the presence of system voltage unbalances and/or system transients/harmonics with the capability of selectively identifying capacitor degradation of a first filter element in order to mitigate further degradation or reduced system performance. In addition, these techniques may be employed without neutral current transformers or other extra components, and certain embodiments allow for negative sequence current computation using current signals or values representing less than all input or output currents and/or voltages of a given power converter 110. Thus, the disclosed techniques may be employed to facilitate advanced fast identification of suspected capacitor degradation while avoiding or mitigating nuisance alarms associated with various other system disturbances, and without the cost associated with extra sensing components. The detected degradation conditions, moreover, can be used by a power converter controller or other device to perform or initiate any number of reporting and/or remedial actions, including without limitation automatically shutting down the power conversion system, etc.

Figure 13:
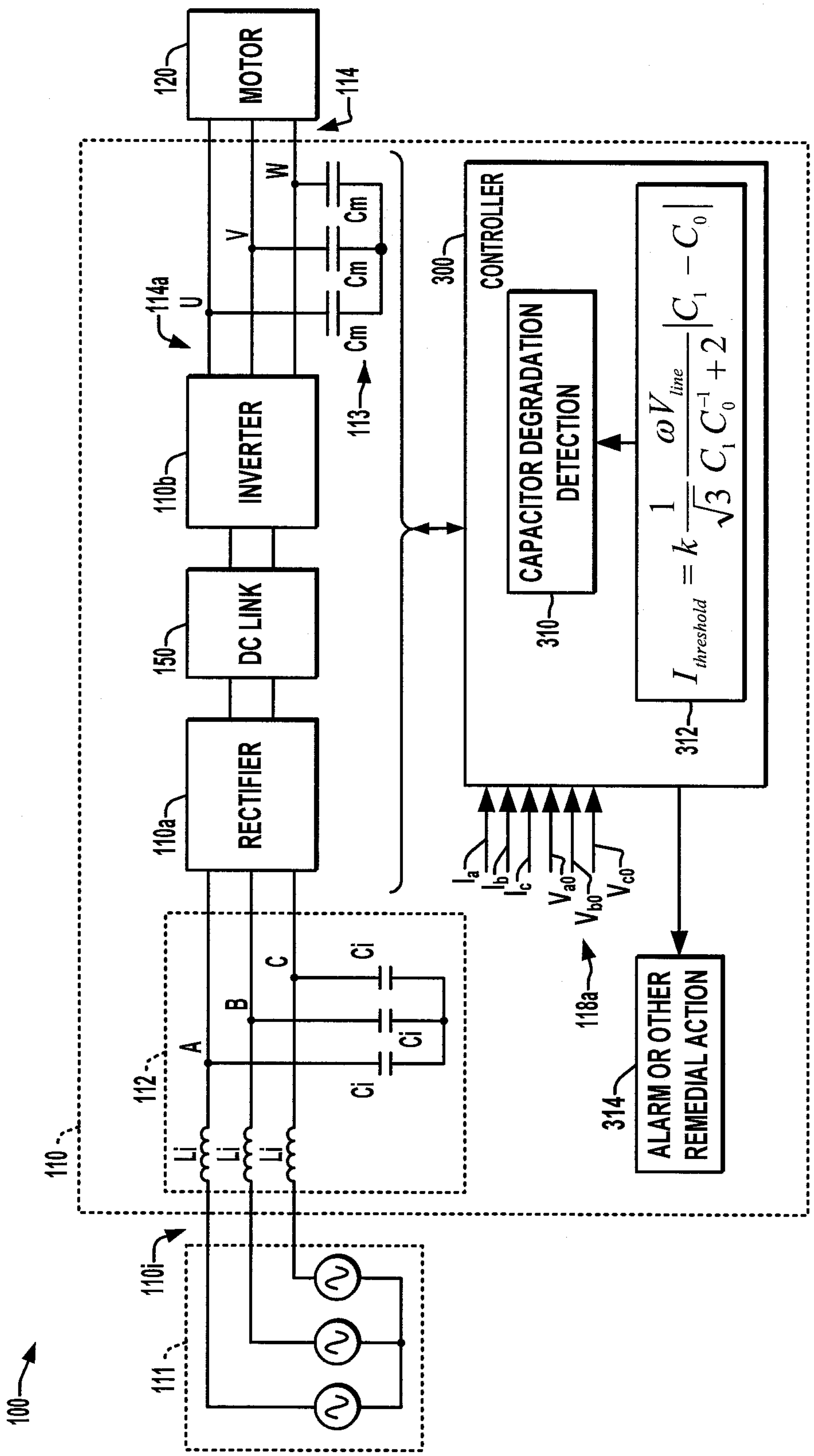
FIG. 13 is a schematic diagram illustrating a power conversion system with capacitor fault detection apparatus to detect degradation of one or more capacitors based at least partially on negative sequence currents.

An exemplary power conversion system 110 is illustrated in FIG. 13, including an AC input 110*i* coupleable to receive AC input power from a multiphase source 111, as well as an AC output 114 coupleable to drive a load such as a multiphase AC motor 120 in one example. An input filter circuit 112 (e.g., an LC multiphase filter arrangement in one example) is connected between the AC input 110*i* and an input of a rectifier 110*a*. The rectifier 110*a* converts AC input power from the source 111 to provide a DC output to a DC link circuit 150, and an inverter 110*b* is provided which converts the DC output of the rectifier 110*a* to provide AC output power at output 114*a* and 114 for driving the load 120. In certain embodiments, the input filter circuit 112 may be a bank of capacitors (e.g., input capacitors Ci connected in a "Y" configuration as shown or in a delta configuration in other embodiments) coupled directly or indirectly with the AC input phase lines A, B and C. In various possible embodiments, the input capacitors Ci may be employed alone or in an LC filter circuit as shown in FIG. 13 in which each phase includes a series coupled first inductor Li connected between the capacitor bank and the AC input 110*i*. In other possible embodiments, a second inductor (not shown) may be connected in series between the capacitor bank and the input to the rectifier 110 forming an LCL or CL filter circuit 112. Other auxiliary components such as damping/discharge resistors or additional inductors in parallel or in series with the capacitors may also be incorporated in the filters.

As shown in FIG. 13, moreover, the power conversion system 110 provides an AC output 114 with output phases U, V and W in the illustrated three-phase embodiment. In certain embodiments, the power conversion system 110 may drive a DC load, in which case the inverter 110*b* and the DC link 150 may be omitted. Where the converter 110 provides an AC output 114, an output filter 113 may be provided, which may include a bank of capacitors (e.g., indicated as "Cm" in FIG. 13). Moreover, as with the input filter 112 described above, the output filter 113 may be a bank of output capacitors Cm connected in a "Y" configuration as shown or in a delta configuration (not shown), and one or more filter inductors may be provided (not shown) to implement an LC and/or CL and/or LCL filter associated with one or more output phases U, V and/or W.

The power converter 110 of FIG. 13 includes a controller 300, which may perform one or more power conversion control functions illustrated and described above in connection with the switch control system 140 in FIGS. 1 and 11. The controller 300 can be implemented as any hardware, processor-executed software, processor-executed firmware, programmable logic and/or combinations thereof to implement the capacitor degradation detection functionality set forth herein and may perform other tasks associated with operation of the power conversion system 110. In certain embodiments, the controller 300 may be implemented as a single processor-based circuit and/or may be implemented using multiple processor elements. For instance, certain capacitor degradation detection functions set forth herein may be implemented in a local controller 300 implemented in the filter circuit 112, 113 and/or such features may be implemented using a centralized controller 300 in certain embodiments. In yet other possible implementations, hardware circuits may be used to implement one or more of the capacitor degradation detection features, alone or in combination with one or more programs processor components.

The illustrated controller 300 of FIG. 13 performs capacitor degradation detection functionality and includes a capacitor degradation detection component 310. In certain embodiments, moreover, the controller 300 may implement or otherwise store a threshold value or values 312 for use in assessing capacitor degradation with respect to negative sequence current as illustrated and described further below. Upon identification of an actual or suspected capacitor degradation situation, the controller 300 in certain embodiments may provide one or more alarms or other indications of such condition 314 and/or may take or initiate one or more remedial actions. As seen in FIG. 13, moreover, the controller 300 in certain embodiments receives or otherwise analyzes a plurality of current and voltage signals or values (e.g., $I_a$, $I_b$, $I_c$, $V_{a0}$, $V_{b0}$ and $V_{c0}$ in FIG. 13 or less than all of these as illustrated and described below in connection with FIGS. 18A-21) for determining and compensating a negative sequence current value for comparison with the threshold 312 for identifying suspected capacitor degradation.

In certain embodiments, a single threshold can be used, whereas other embodiments are possible in which multiple thresholds can be used to define a range of operation, with the controller 300 comparing the compensated negative sequence current value with the defined range and selectively identifying a capacitor degradation if the negative sequence current value is outside of the defined range, such as above an upper threshold or below a lower threshold. Alternatively or in combination, multiple threshold comparisons can be made with degradation identified based on one or more Boolean conditions regarding comparison results, such as identifying degradation if all thresholds are exceeded by various parameters associated with negative sequence currents, identifying degradation if at least one threshold is exceeded, or any other logical combinations based on multiple threshold comparisons.

Several implementations are illustrated and described below in which the controller 300 assesses capacitor degradation with respect to capacitors associated with the input filter circuit 112 in the power converter 110. Other embodiments are possible in which capacitor degradation is evaluated with respect to one or more capacitors (Cm) associated with the output filter circuit 113, wherein the described apparatus and techniques are applicable to filter circuits operatively coupled with either or both of the AC input 110*i* and/or the AC output 114 (if present) of a given power conversion system 110. Accordingly, such capacitors are hereinafter indicated as "CF" (e.g., FIGS. 14 and 15A-15D) which may be input capacitors Ci or output capacitors Cm.

Figure 14:
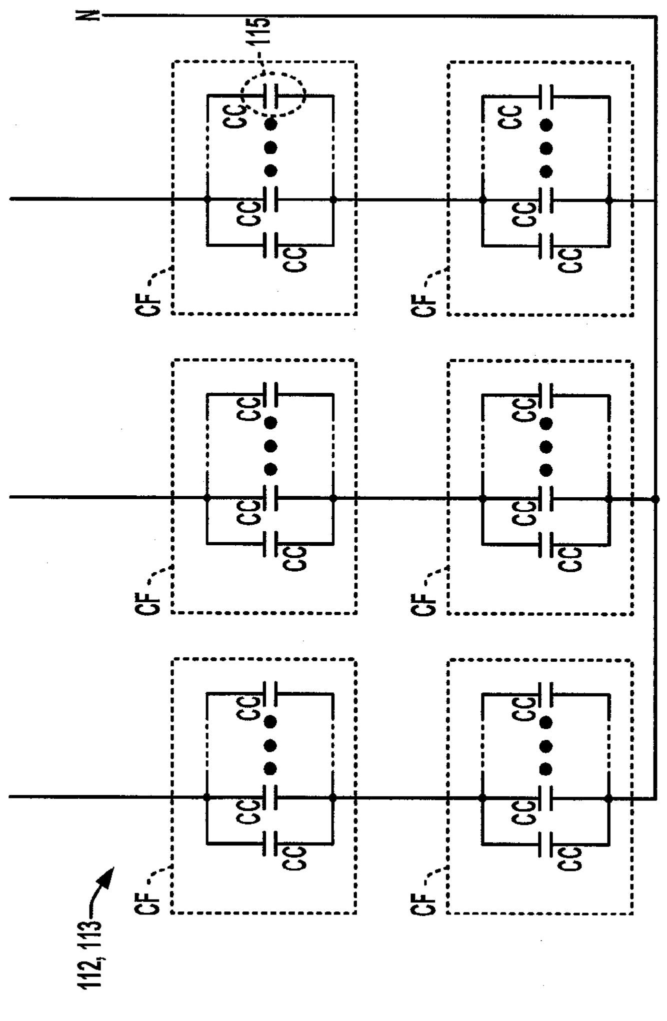
FIG. 14 is a schematic diagram illustrating exemplary internal construction of a bank of capacitors using multiple component capacitors in the power conversion system of FIG. 13.

FIG. 14 illustrates one possible implementation of a bank of such capacitors CF connected in a "Y" configuration with individual capacitors CF being connected between a corresponding AC line (e.g., whether input phase lines A, B and C or output phase lines U, V and W) and a common connection point, where the common connection may be floating, may be impedance grounded and/or may be directly grounded in various embodiments with respect to a system ground or neutral node. As noted above, moreover, the capacitors CF may alternatively be connected in a delta configuration with each corresponding AC phase line being connected (directly or indirectly) to a common node joining two of the capacitors CF. It is further noted that the input and/or output filter circuits 112, 113 may also include one or more discharging/damping elements such as discharge resistors (not shown) that may be individually connected in parallel across a corresponding one of the capacitors CF, whether in a Y-configuration or a delta-configuration, and whether the capacitor bank forms the entire filter circuit or is part of an LC and/or CL and/or LCL filter configuration associated with the input 110*i* and/or the output 114.

As seen in FIG. 14, the individual capacitors CF may themselves be constructed using a plurality of component capacitors CC, where the component capacitors CC may be connected with one another in any suitable series, parallel and/or series/parallel combinations to form the corresponding capacitor CF with the required capacitance and voltage ratings. In this regard, the threshold 312 used by the exemplary controller 300 and the capacitor degradation detection component 320 thereof may be advantageously set so as to identify suspected degradation in a single component capacitor CC 115 in order to take appropriate action (if any) before such degradation leads to damage to other component capacitors CC of the same capacitor CF and/or to other capacitors CF in the capacitor bank.

Figure 15:
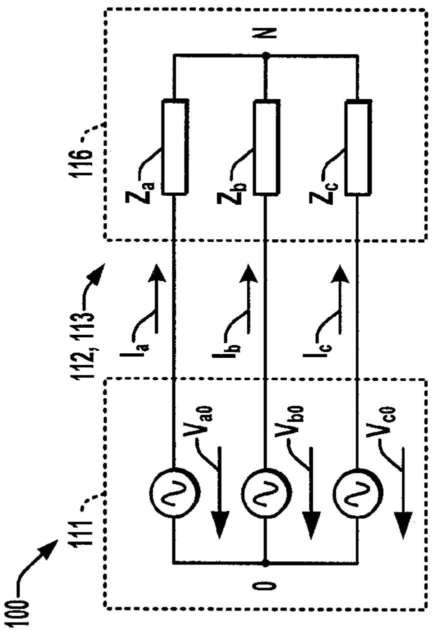
FIG. 15 is a schematic diagram illustrating measured AC voltages and line currents for computation of compensated negative sequence current in the power conversion system of FIG. 13.
Figure 15A:
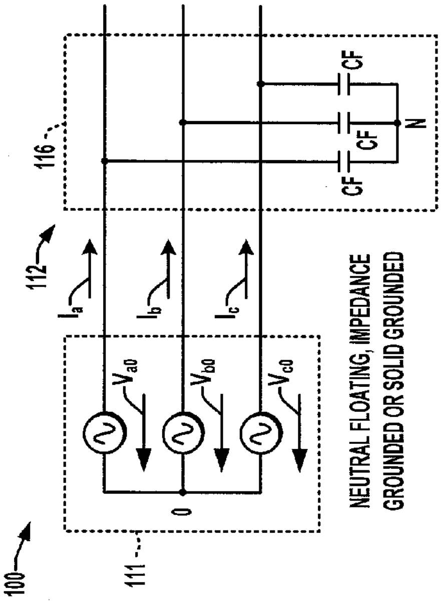
FIGS. 15A-15D are schematic diagrams illustrating various different input filter configurations in the power conversion system of FIG. 13.
Figure 15B:
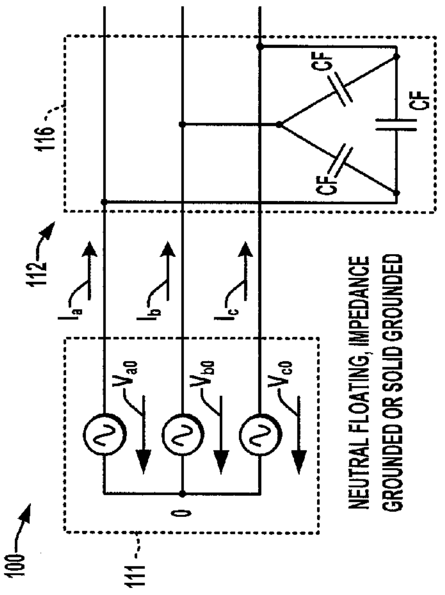
Figure 15C:
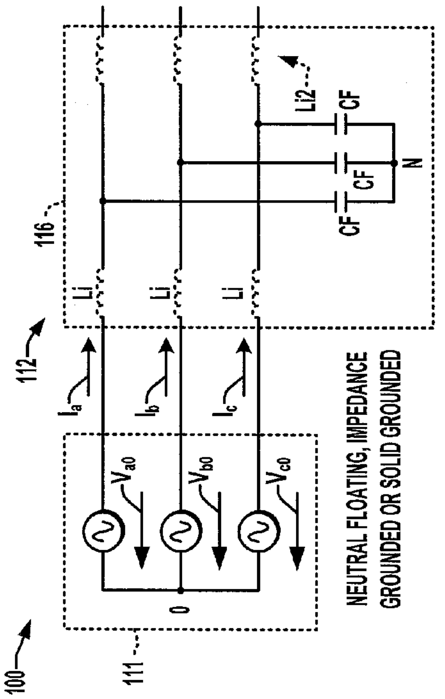
Figure 15D:
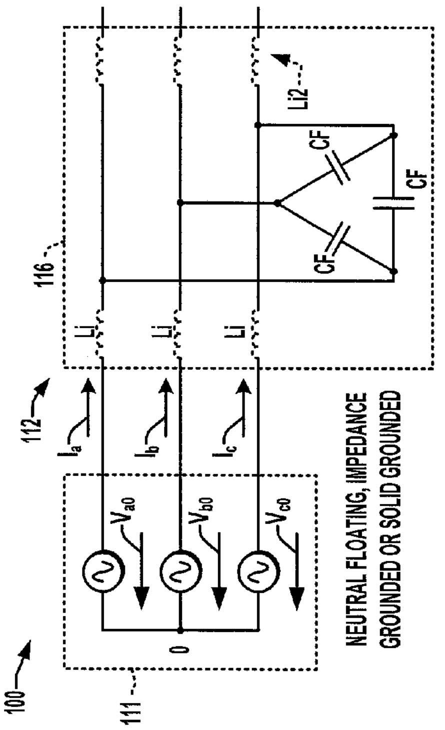

Referring to FIGS. 15-15D, FIG. 15 provides a simplified rendering of the AC voltages and currents associated with impedances $Z_a$, $Z_b$ and $Z_c$ associated with a load 116 seen by a source, such as the input power source 111 in one example. As seen in FIGS. 15A-15D, the load 116 may be one or more different architectures of an input filter circuit 112 (e.g., connected between the AC input 110*i* and the rectifier 110*a* in FIG. 13 above) driven by the source 111, and the same relationship exists between the output of the inverter 110*b* (as a source of AC power) and the output filter circuit 113 (e.g., FIG. 13). In operation, the capacitor degradation detection component 310 of the controller 300 may receive any form of current measurements, such as two or more of the line currents $I_a$, $I_b$ and $I_c$ in certain embodiments, which may be obtained as any suitable signals and/or values that represent corresponding current flowing in the AC phase lines A, B and/or C (or in the output phases U, V and/or W for the output filter 113). In other possible embodiments, signals and/or values representing the currents flowing in the capacitors (capacitor currents) can be sensed and used for the capacitor degradation detection functionality set forth herein. In particular, the controller 300 in certain embodiments identifies suspected degradation of at least one capacitor CF (or component capacitors CC thereof) based at least in part on a negative sequence current associated with the filter circuit 112 and/or 113.

In addition, the controller 300 receives or otherwise obtains voltage signals and/or values representing AC voltages associated with the AC input 110*i* and/or the AC output 114 of the power conversion system, such as $N_{a0}$, $V_{b0}$ and $V_{c0}$ in FIG. 13. As seen in FIGS. 15A-15D, for instance, signals and/or values representing the phase voltages $V_{a0}$, $V_{b0}$ and $V_{c0}$ may be used, with reference to a "0" node indicated in the figures, where this "0" node may be floating, may be impedance grounded, maybe directly grounded and/or may be connected to a neutral node "N" of the system. In this regard, the "0" node may form a "neutral" of the input source 111, or may (but need not) be a common connection node of the inverter 110*b* with respect to the output capacitor 113 (FIG. 13). Likewise, the common connection of the capacitors CF in the Y-connection embodiments of FIGS. 15A and 15C can be floating, can be connected to a "neutral" of the power converter 110, or can be connected to a neutral or a ground through an impedance or directly.

With respect to the voltage signals and/or values used by the controller 300 for compensating the negative sequence current, moreover, line-to-line voltages may be used and/or line-to-ground voltages may be used (e.g., FIG. 18B below). The non-limiting configurations of FIGS. 15A-15D are illustrated with respect to input filter circuit 112 and different configurations thereof, but the same applies with respect to the output filter circuit 113. FIG. 15A illustrates an example with an input filter circuit 112 including a capacitor bank formed by Y-connection of capacitors CF and the example of FIG. 15B shows a corresponding delta-connected input filter 112 for the illustrated three-phase embodiments. FIG. 15C shows an LC or LCL input filter circuit 112 with the capacitors CF being connected in a Y-configuration, and FIG. 15D illustrates an LC or LCL input filter 112 with the capacitors CF in a delta-configuration with the corresponding filter inductors Li. The output of the filters in FIGS. 15B through 15D may be connected to another load for example to the rectifier in a converter system, or may be unconnected in PFC capacitor banks or LC power filters in the power systems.

Figure 16:
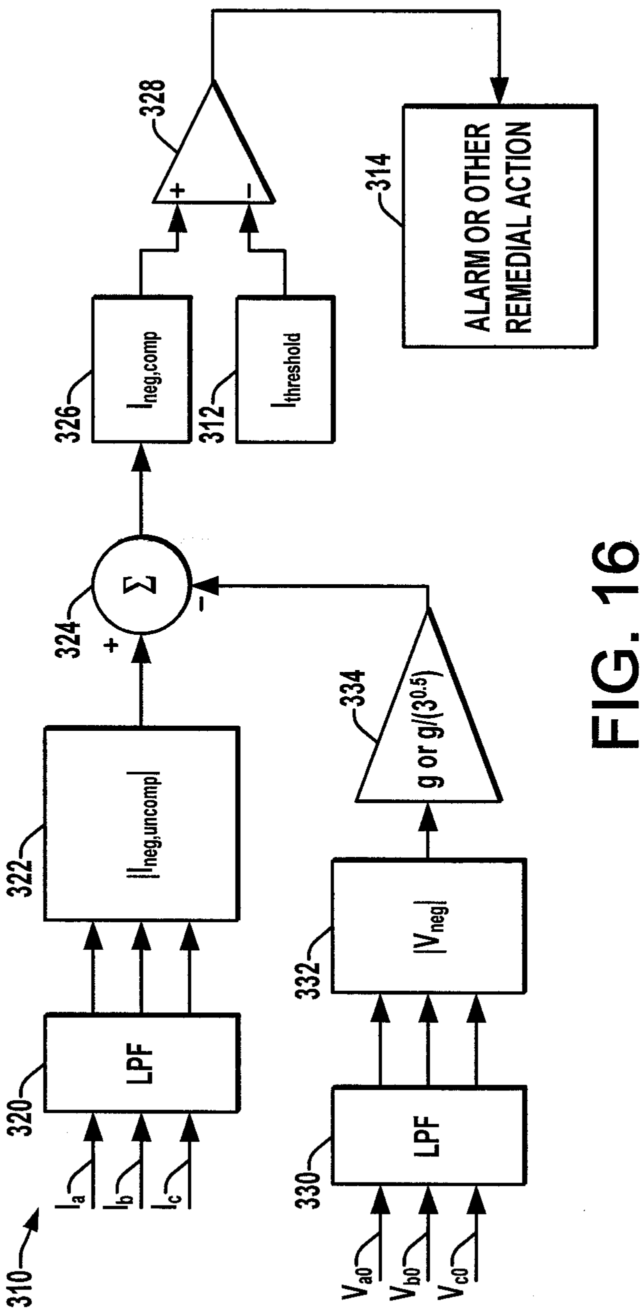
FIG. 16 is a schematic diagram illustrating negative sequence current computation using three measured phase currents and compensation using three measured phase voltages for comparison with a current threshold to detect capacitor degradation.

Referring also to FIG. 16, the controller 300 in certain embodiments computes an uncompensated negative sequence current value $I_{neg,uncomp}$ (322 in FIG. 16) at least partially according to two or more of the current signals or values representing AC currents (e.g., line currents, load currents, capacitor currents, etc.) associated with the AC input 110*i* or with the AC output 114*a* and/or 114. In addition, the controller 300 also obtains and analyzes two or more voltage signals or values representing AC voltages associated with the AC input 110*i* or the AC output 114 for compensation of the uncompensated negative sequence current value $I_{neg,uncomp}$. In this regard, the inventors have appreciated that compensating the negative sequence current value according to the AC voltages can provide a compensated negative sequence current value (e.g., $I_{neg,comp}$ 326 in FIG. 16) which can be assessed essentially independent of voltage unbalance conditions in the line (e.g., source 111) or other system transients and/or harmonics. This advantageously allows selective identification of suspected capacitor degradation situations without false identification based on voltage unbalance or other disturbances.

The components of the capacitor degradation detection component 310 in FIG. 16 may be implemented in hardware, processor-executed firmware, processor-executed software, programmable logic and/or combinations thereof in various embodiments. As seen in FIG. 16, the capacitor degradation detection component 310 of the controller 300 in certain embodiments receives current signals or values representing AC currents $I_a$, $I_b$ and $I_c$ and may optionally provide a low pass filter 320 with a cutoff frequency set above the fundamental of the input source 111 such that the output of the low pass filter 320 represents primarily the fundamental AC component of the AC currents in the filter circuit 112. With respect to output filter degradation detection embodiments, the cutoff frequency of the low pass filter 320 may be set to the fundamental frequency of the inverter 110*b* (e.g., which may be above the line frequency of the power source 111). The filtered current signals or values are used by the degradation detection component 310 to compute the uncompensated negative sequence current value $I_{neg,uncomp}$ 322 which is then provided to a positive input of a summing junction 324. In certain embodiments where three current signals or values are available (e.g., phase currents $I_a$, $I_b$ and $I_c$) the degradation detection component 310 computes the uncompensated negative sequence current value $I_{neg,uncomp}$ 322 according to the following formula (I):

$$I_{neg,uncomp} = \frac{1}{3}\begin{bmatrix} 1 & \alpha^2 & \alpha \end{bmatrix}\begin{bmatrix} I_a \\ I_b \\ I_c \end{bmatrix}, \quad (1)$$

where $\alpha = e^{j120°}$.

In addition, the detection component 310 receives voltage signals and/or values (e.g., as $V_{a0}$, $V_{b0}$ and $V_{c0}$) representing AC voltages associated with the AC input 110*i* or the AC output 114 for compensating the negative sequence current value $I_{neg,uncomp}$. As mentioned above, other forms of AC voltage signals and/or values can be used, such as those representing line-line voltage measurements, line-neutral voltage measurements line-ground measurements, etc. In the illustrated embodiment, moreover, a low pass filter 330 may be used to remove harmonics from the received voltage signals and/or values, having a filter cutoff frequency set above the corresponding fundamental frequency, which may be the same cutoff frequency used in the low pass filter 320. The filtered voltage signals and/or values are then used to compute a negative sequence voltage value $V_{neg}$ 332, and a scaling component 334 may optionally be provided to scale the filtered voltage signals and/or values by a constant "g" which may be the admittance of the capacitors CF or of the filter circuit 112 (e.g. LC and/or LCL implementations) in certain embodiments. Moreover, the scaling component 334 in certain embodiments may divide the scaling factor g by the square root of 3 where line-line or line-ground voltages are used (e.g., phase voltage=line voltage divided by the square root of 3).

The scaled negative sequence voltage value is provided to a negative input of the summer 324 to essentially subtract the negative sequence voltage contribution from the negative sequence current value 322. As mentioned above, this advantageously removes the voltage contribution to the negative sequence situation in the power converter 110 to create a compensated negative sequence current value $I_{neg,\ comp}$ 326. A comparator 328 compares the compensated negative sequence current value $I_{neg,comp}$ 326 with a threshold value $I_{threshold}$ 312, which is computed in certain embodiments according to the following equation (2):

$$I_{threshold} = k\frac{1}{\sqrt{3}}\frac{\omega V_{line}}{C_1 C_0^{-1} + 2}|C_1 - C_0| \tag{2}$$

where k is a predefined sensitivity factor, ω is the fundamental frequency (2Πf), $V_{line}$ is the rms values of the line voltage, $C_1$ is a capacitance value associated with a certain capacitor degradation scenario, for example a single component capacitor failure (e.g., CC 115 shorted in one of the capacitors CF in one example, considering any series, parallel and/or series/parallel configuration of the component capacitors CC as described above in connection with FIG. 14), and $C_0$ is a capacitance associated with a healthy capacitor CF or component CC thereof. In certain embodiments, k may be user-adjustable and/or may be automatically adjusted by the controller 300 based on one or more operating conditions of the power converter 110 such that when k is less than unity, detection is more sensitive to failures, and detection is less sensitive but more robust when k is greater than or equal to 1.

If the compensated negative sequence current value $I_{neg,comp}$ 326 exceeds the threshold value $I_{threshold}$ 312, the degradation detection component 310 identifies suspected degradation of at least one of the capacitors CF and may take or initiate one or more reporting and/or remedial actions 314. Thus, the degradation determination is accomplished at least partially according to the uncompensated negative sequence current value $I_{neg,uncomp}$. In other possible embodiments, the negative voltage sequence compensation can be omitted or modified, with the uncompensated negative sequence current value $I_{neg,uncomp}$ being compared with a threshold value or values for selective identification of suspected capacitor degradation.

Figure 17:
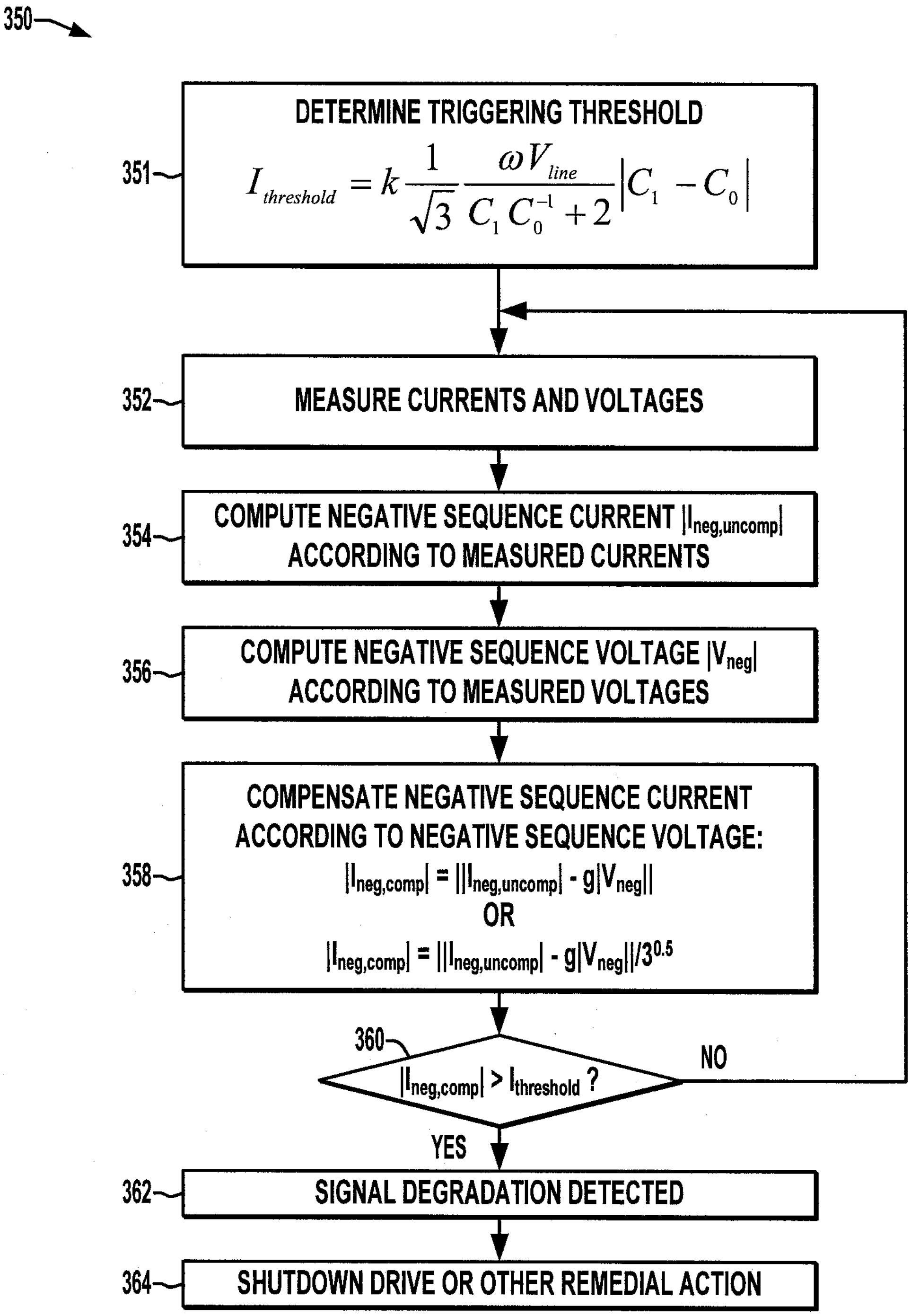
FIG. 17 is a flow diagram illustrating a method for detecting capacitor degradation based on negative sequence current.

FIG. 17 illustrates a process 350 for detecting capacitor degradation based on negative sequence current in which a negative sequence current value (e.g., $I_{neg,uncomp}$ 322 in FIG. 16 above) is computed according to measured currents and compensated based on voltage signals or values and suspected degradation is identified at least partially according to the compensated negative sequence current value (e.g., $I_{neg,comp}$ 326) and an automatically calculated threshold of negative sequence current according to the capacitor bank configuration and one or more capacitor degradation scenarios. At 351, a threshold is calculated according to the capacitance change due to the capacitor degradation based at least partially on a sensitivity factor. At 352, AC currents and voltages are measured, for example, including two or more AC currents and voltages associated with the input or output filters 112, 113 in the power converter 110 of FIG. 13. The current and voltage measurements at 352 may be accomplished using any suitable sensors and/or signals and/or values representing such currents and voltages may be provided from any suitable system component or from an external system. At 354, uncompensated negative sequence current value is computed (e.g., $I_{neg,uncomp}$ 322) at least partially according to the measured currents, and a negative sequence voltage (e.g., $V_{neg}$ 332 in FIG. 16) is computed at 356 at least partially according to the measured voltages. The negative sequence voltage value may be scaled in certain embodiments (e.g., using a scaling factor "g" 334 in FIG. 16 above), where the scaling factor g 334 in certain embodiments is the filter circuit for capacitor or filter admittance and may be divided by the square root of 3 where line-line voltages are used.

At 358 in FIG. 17, the uncompensated negative sequence current value is compensated according to the negative sequence voltage $V_{neg}$ 332 or otherwise compensated according to the underlying voltage measurements in order to obtain the compensated negative sequence current value (e.g., $I_{neg,comp}$ 326). In certain embodiments, for example, the compensation at 358 may include subtracting the scaled negative sequence voltage value $V_{neg}$ 332 from the uncompensated negative sequence current value $I_{neg,uncomp}$ 322. In certain embodiments, the compensation may employ the absolute values of the negative sequence current and voltage according to the following formula (3):

$$I_{neg,comp} = \|I_{neg,comp}| - g|V_{neg}\| \tag{3}$$

where the compensation formula at 358 may include the square root of 3 denominator for line-line or line-ground voltage computations or this may be done as part of scaling at 356 in various embodiments.

A determination is made at 360 as to whether the compensated negative sequence current value $I_{neg,comp}$ 326 exceeds a threshold value (e.g., $I_{threshold}$ 312 above). If not (NO at 360), the process 350 returns to 352-358 as described above. If the threshold is exceeded (YES at 360), the detected capacitor degradation may be signaled at 362 and one or more remedial actions may be taken at 364, including without limitation shutting down the power conversion system (e.g., motor drive) 110. In this manner, the compensated negative sequence current value $I_{neg,comp}$ 326 is compared with a threshold $I_{threshold}$ 312 and suspicion of capacitor degradation (degradation detection) is based on the comparison.

Figure 18A:
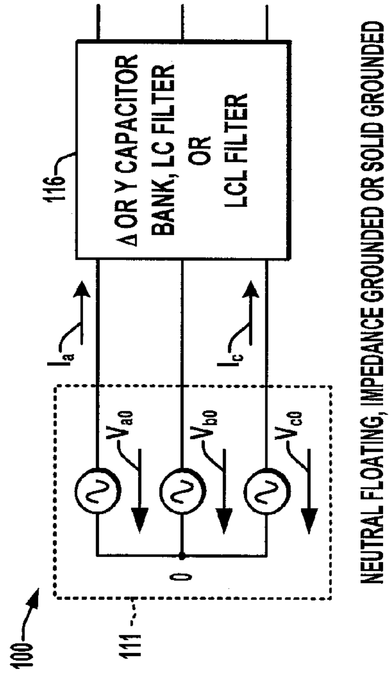
FIGS. 18A-18D are schematic diagrams illustrating measurement of three phase or line-to-ground voltages and two currents for computation and compensation of negative sequence current in a three-phase power converter.
Figure 18B:
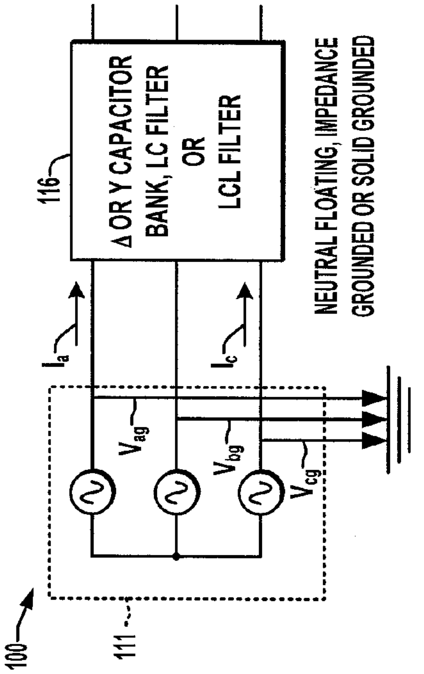
Figure 18C:
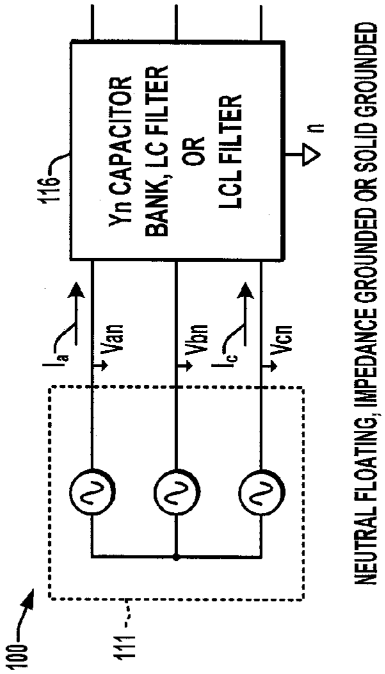
Figure 18D:
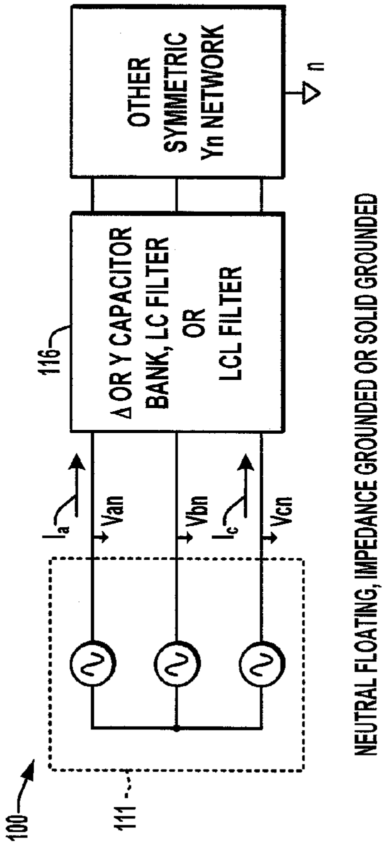
Figure 19:
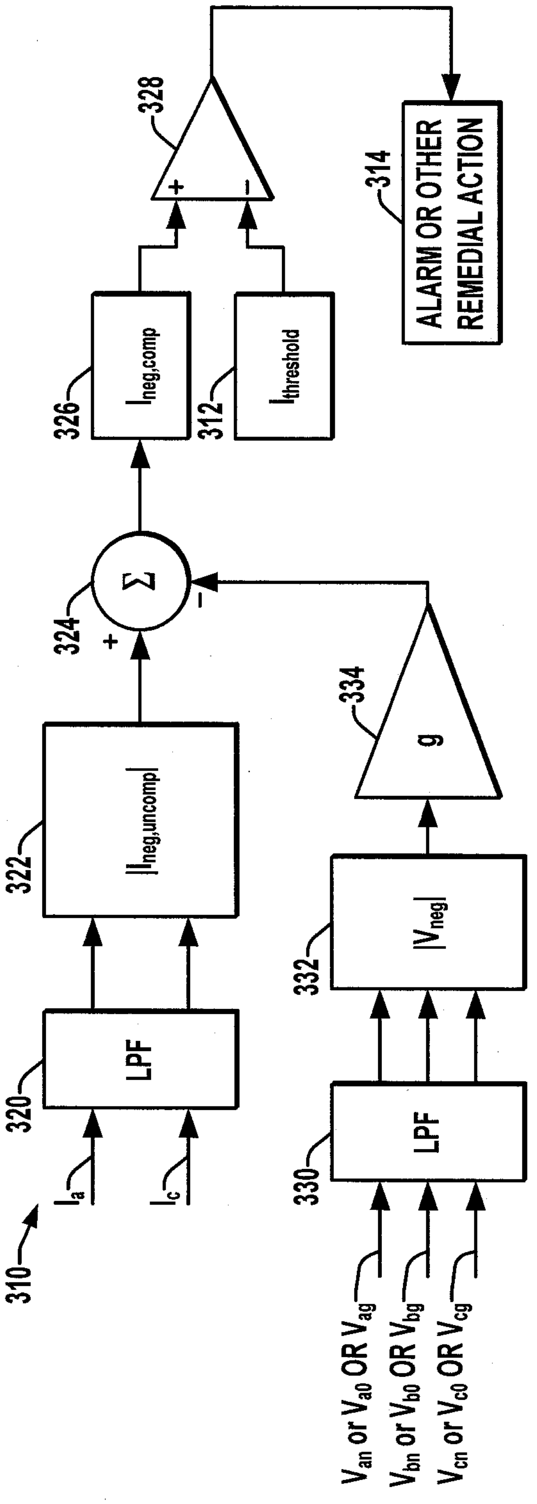
FIG. 19 is a schematic diagram illustrating negative sequence current computation using two measured phase currents in the embodiments of FIGS. 18A-18D for threshold comparison to detect capacitor degradation.

Referring now to FIGS. 18A-21, the capacitor degradation determination may be made using negative sequence current and/or voltage computations performed using signals and/or values representing less than all of the AC currents and/or voltages. For instance, in a three-phase system as illustrated in FIG. 13 (whether with respect to the capacitors of the input filter circuit 112 or of the output filter 113), the controller 300 may be provided with only two of the three phase current signals or values (e.g., $I_a$ and $I_c$). As seen in FIG. 19, these current signals or values may be filtered using the low pass filter 320 in certain embodiments. In certain embodiments, the degradation detection component 310 in FIG. 19 computes the uncompensated negative sequence current value $I_{neg,uncomp}$ 322 based on $I_a$ and $I_c$ (low pass filtered or not) according to the following formula (4):

$$I_{neg} = \frac{1}{3}[1 \quad \alpha^2 \quad \alpha]\begin{bmatrix} I_a \\ -(I_a + I_c) \\ I_c \end{bmatrix}, \tag{4}$$

where $\alpha = e^{j120°}$.

In the Examples of FIGS. 18A-19, moreover, the degradation detection component 310 of the controller 300 is provided with these two current signals or values along with three voltage signals or values representing phase voltages measured between the line and power supply neutral 0 (e.g., $V_{a0}$, $V_{b0}$ and $V_{c0}$ in FIG. 18A) or phase voltage measured between the line to capacitor neutral n ($V_{an}$, $V_{bn}$ and $V_{cn}$ FIG. 18C), or to an artificial neutral n in any other Yn network on the same bus ($V_{an}$, $V_{bn}$ and $V_{cn}$ FIG. 18D), or line-to-ground voltages ($V_{ag}$, $V_{bg}$ and $V_{ag}$ in FIG. 18B) which are optionally low pass filtered via filter 330 and used to compute the negative sequence voltage value $V_{neg}$ 332 with optional scaling at 334 as described above in connection with FIG. 16. In this regard, the line-to-neutral voltage measurements in certain embodiments can be the source voltage, the capacitor/filter voltage or voltage of any Y-connected load on the bus. The capacitor/filter voltage measurement can be taken from the capacitor terminals or the inductor terminals. Moreover, as discussed above, any or all of the neutrals or connections can be floating, solid grounded or impedance grounded in various embodiments. The power supply may be either Δ or "Y" connected when the voltage is measured relative to capacitor neutral or artificial neutral. As previously discussed, the summer 324 in FIG. 19 subtracts the negative sequence voltage value $V_{neg}$ 332 from the uncompensated negative sequence current value $I_{neg,uncomp}$ 322 to obtain the compensated negative sequence current value $I_{neg,comp}$ 326 for threshold comparison by the comparator 328 for determination of whether capacitor degradation is suspected to selectively initiate alarm or other remedial action 314.

Figure 20:
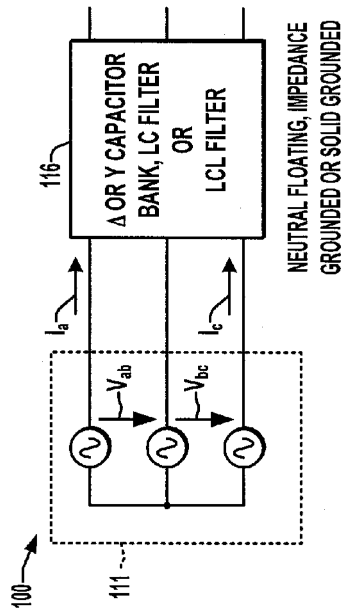
FIG. 20 is a schematic diagram illustrating another embodiment for measurement of two line-to-line voltages and two phase currents in a three-phase power converter embodiment.
Figure 21:
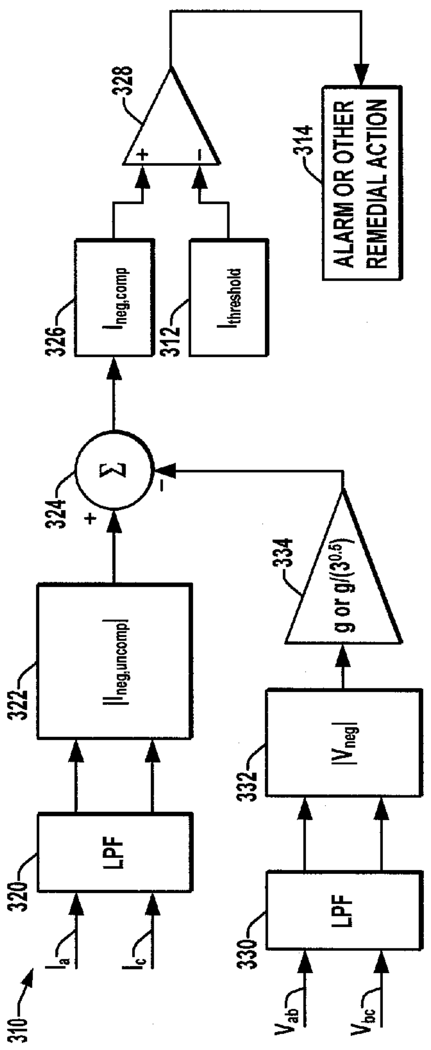
FIG. 21 is a schematic diagram illustrating negative sequence current computation using two measured phase currents and compensation according to negative sequence voltage computed using the two measured voltages in the embodiment of FIG. 20.

FIGS. 20 and 21 illustrate another possible example in which only two of the three phase currents are used in computing the uncompensated negative sequence current value $I_{neg,uncomp}$ 322, and in which only two of the three AC voltages (e.g., $V_{ab}$ and $V_{bc}$ in FIG. 20) are used to compute the negative sequence voltage value $V_{neg}$ 332. In these embodiments, any two of the three-phase currents can be used, the neutrals can be floating, solid grounded or impedance grounded, and the line-to-neutral voltage measurements can be the source voltage, the capacitor/filter voltage or voltage of any Y-connected load on the bus. The capacitor/filter voltage measurement can be taken from the capacitor terminals or the inductor terminals. As in the embodiments of FIGS. 16 and 19 above, moreover, the current signals or values $I_a$ and $I_c$ may be filtered using the low pass filter 320 and the capacitor degradation detection component 310 computes the uncompensated negative sequence current value $I_{neg,uncomp}$ 322, for example, using the above formula (4) as described in connection with FIG. 19. In this embodiment, moreover, the detection component 310 may optionally filter the voltage signals or values $V_{ab}$ and $V_{bc}$ via filter 330 and computes the negative sequence voltage value $V_{neg}$ 332, for example, using equation (4) above with substitution of the voltage signals or values $V_{ab}$ and $V_{bc}$ for the current signals or values $I_a$ and $I_c$. The negative sequence voltage value $V_{neg}$ 332 may then be scaled at 334 and subtracted from the uncompensated negative sequence current value $I_{neg,uncomp}$ 322 at the summer 324 to derive the compensated negative sequence current $I_{neg,comp}$ 326 which is then compared to the threshold 312 for selective identification of suspected capacitor degradation conditions in the power conversion system 110.

The apparatus and techniques described above in connection with FIGS. 13-21 employ negative sequence currents and optional compensation according to negative sequence voltages by which first element degradation can be detected for preventing further degradation in system components for a power conversion application and may be used for triggering automatic system shutdown and/or other reporting or remedial actions. Subsequent further element degradation can also be detected by comparing the same negative sequence currents with optional compensation according to negative sequence voltages, with the threshold computed according to equation (2) corresponding to further degradation scenarios. Moreover, the degradation detection component 310 of the controller 300 can perform this degradation detection function while selectively avoiding nuisance alarms based on system voltage unbalance conditions and/or transients or harmonics in the system 110 by virtue of the negative sequence voltage compensation. These techniques provide certain advantages over zero sequence measurement techniques including the ability to use currently sensed AC currents and voltages without requiring addition of further sensors or detectors, such as the neutral current and/or voltage sensors (e.g., current transformers, voltage sensors, etc.) required for other capacitor fault or degradation approaches. In addition, as seen in FIGS. 18A-21, these techniques may also be implemented without requiring complete sensor coverage for all the system AC currents and/or voltages. Furthermore, these techniques advantageously facilitates differentiation between capacitor degradation conditions and other system transients or harmonics regardless of grounding topology.

Thus, no additional cost or components are required to implement the capacitor degradation detection concepts for motor drives and other power conversion systems 110 in which normal motor control techniques only require a limited set of system variables (e.g., $V_{ag}$, $V_{bg}$, $V_{cg}$, $I_a$, $I_c$ in one example, or $V_{ab}$, $V_{bc}$, $I_a$, $I_c$ in another example). In this manner, the above described negative sequence current approach can be used without hardware modifications or the added expense, size, and weight associated with additional sensors. In addition, these negative sequence techniques facilitate real-time compensation for system unbalance and are independent of neutral grounding impedance, and can thus be employed in existing systems with a variety of neutral connection topologies. Moreover, these concepts may be successfully employed to employ predictable thresholds applicable to different capacitor bank topologies (different combinations of component capacitors CC connected in a variety of series, parallel and/or series/parallel configurations for constructing the individual capacitors CF). In addition, these techniques may successfully identify different forms of capacitor degradation including without limitation line-to-neutral and line-to-line short-circuit degradation effects.

These techniques, moreover, find utility in association with motor drives or any form a power conversion system 110 or other products in which multiphase AC capacitor circuits are used and/or relays for the protection of power capacitors, wherein these techniques are not limited to motor drive input filter circuits 112 or to motor drive output filter circuits 113 as illustrated herein. Furthermore, the compensation techniques can be used for other detection approaches based on current unbalance, etc., and furthermore this approach can be used for selective identification of suspected capacitor degradation when the power conversion system 110 is running and also when the system is energized but not actively driving a load 120. Furthermore, these techniques facilitate element degradation detection (e.g., capacitor component elements CC in FIG. 14 above) which can be accomplished using a minimal set of current and voltage values (e.g., less than all currents and/or less than all voltages), and these techniques can be applied with respect to negative sequence approaches as well as compensated current unbalance approaches. Furthermore, the negative sequence techniques can be employed to provide fast detection for short-circuit faults (e.g., using $I_a$, $I_c$, $I_{gnd}$, $V_{ab}$, $V_{bc}$, $V_{kn}$, $V_{kg}$, k=a,b,c); line-to-neutral shorts (e.g., line over-current plus $V_{kn}$<threshold for certain period of time; line-to-ground short conditions (e.g., $I_{gnd}$>threshold and $V_{kg}$<threshold or $V_{kn}$<threshold for a threshold period of time); and/or line-to-line short conditions, for example, a line overcurrent condition continuing for a threshold period of time.

The above examples are merely illustrative of several possible embodiments of various aspects of the present disclosure, wherein equivalent alterations and/or modifications will occur to others skilled in the art upon reading and understanding this specification and the annexed drawings. In particular regard to the various functions performed by the above described components (assemblies, devices, systems, circuits, and the like), the terms (including a reference to a "means") used to describe such components are intended to correspond, unless otherwise indicated, to any component, such as hardware, processor-executed software, or combinations thereof, which performs the specified function of the described component (i.e., that is functionally equivalent), even though not structurally equivalent to the disclosed structure which performs the function in the illustrated implementations of the disclosure. In addition, although a particular feature of the disclosure may have been disclosed with respect to only one of several implementations, such feature may be combined with one or more other features of the other implementations as may be desired and advantageous for any given or particular application. Also, to the extent that the terms "including", "includes", "having", "has", "with", or variants thereof are used in the detailed description and/or in the claims, such terms are intended to be inclusive in a manner similar to the term "comprising".

The following is claimed:

1. A power conversion system, comprising:

an AC input coupleable to receive AC input power from a power source;

a rectifier operative to convert the AC input power to provide a DC output;

an inverter operatively coupled with the DC output of the rectifier to provide AC output power to an AC output; and a filter circuit comprising a plurality of capacitors operatively coupled with the AC input or the AC output;

a controller operative to identify suspected degradation of at least one of the capacitors at least partially according to a negative sequence current associated with the filter circuit.

2. The power conversion system of claim 1, wherein the filter circuit is an input filter coupled between the AC input and the rectifier.

3. The power conversion system of claim 1, wherein the controller is operative to compute an uncompensated negative sequence current value at least partially according to a plurality of current signals or values representing AC currents associated with the AC input or the AC output, and to identify suspected degradation of at least one of the capacitors at least partially according to the uncompensated negative sequence current value.

4. The power conversion system of claim 3, wherein the controller is operative to compensate the uncompensated negative sequence current value at least partially according to a plurality of voltage signals or values representing AC voltages associated with the AC input or the AC output to obtain a compensated negative sequence current value, and to identify suspected degradation of at least one of the capacitors at least partially according to the compensated negative sequence current value.

5. The power conversion system of claim 4, wherein the controller is operative to compute a negative sequence voltage value at least partially according to the plurality of voltage signals or values, to compute the compensated negative sequence current value according to the uncompensated negative sequence current value and the negative sequence voltage value, and to selectively identify suspected degradation of at least one of the capacitors if the compensated negative sequence current value exceeds a threshold value.

6. The power conversion system of claim 5, wherein the controller is operative to compute the uncompensated negative sequence current value according to current signals or values representing less than all of the AC currents associated with the AC input or the AC output.

7. The power conversion system of claim 5, wherein the controller is operative to compute the negative sequence voltage value according to a plurality of voltage signals or values representing less than all of the AC voltages associated with the AC input or the AC output.

8. The power conversion system of claim 4, wherein the controller computes the threshold value according to at least one predefined capacitance change due to capacitor degradation in a capacitor bank based at least partially on a sensitivity factor.

9. The power conversion system of claim 4, wherein the controller is operative to compute the uncompensated negative sequence current value according to current signals or values representing less than all of the AC currents associated with the AC input or the AC output.

10. The power conversion system of claim 3, wherein the controller is operative to compute the uncompensated negative sequence current value according to current signals or values representing less than all of the AC currents associated with the AC input or the AC output.

11. A method for protection relays and/or controllers to identify suspected capacitor degradation in a power system, the method comprising:

computing an uncompensated negative sequence current value at least partially according to a plurality of current signals or values representing AC currents associated with capacitors or filters of the power system;

compensating the uncompensated negative sequence current value at least partially according to a plurality of voltage signals or values representing AC voltages associated with capacitors or filters to obtain a compensated negative sequence current value; and identifying suspected degradation of at least one capacitor of the power system at least partially according to the compensated negative sequence current value.

12. The method of claim 11, wherein compensating the uncompensated negative sequence current value comprises:

computing a negative sequence voltage value at least partially according to the plurality of voltage signals or values; and computing the compensated negative sequence current value at least partially according to the uncompensated negative sequence current value and the negative sequence voltage value.

13. The method of claim 12, wherein computing the compensated negative sequence current value comprises subtracting a power supply contribution to negative sequence current obtained according to the negative sequence voltage value from the uncompensated negative sequence current value.

14. The method of claim 13, wherein computing the compensated negative sequence current value comprises scaling the negative sequence voltage value to obtain a scaled negative sequence voltage value, and subtracting the power supply contribution to negative sequence current obtained according to the scaled negative sequence voltage value from the uncompensated negative sequence current value.

15. The method of claim 14, wherein identifying suspected degradation of at least one capacitor of the conversion system comprises:

computing a threshold value of negative sequence current according to predefined capacitance change due to capacitor degradation in a capacitor bank based at least partially on a sensitivity factor;

comparing the compensated negative sequence current value with the threshold value; and selectively identifying suspected degradation of at least one of the capacitors if the compensated negative sequence current value exceeds the threshold value.

16. The method of claim 15, wherein the uncompensated negative sequence current value is computed according to current signals or values representing less than all of the AC currents associated with capacitors or filters of the power system.

17. The method of claim 12, wherein the uncompensated negative sequence current value is computed according to current signals or values representing less than all of the AC currents associated with capacitors or filters of the power system.

18. The method of claim 12, wherein the negative sequence voltage value is computed according to a plurality of voltage signals or values representing less than all of the AC voltages associated with the AC input or the AC output of capacitors or filters of the power system.

19. The method of claim 11, wherein the uncompensated negative sequence current value is computed according to current signals or values representing less than all of the AC currents associated with capacitors or filters of the power system.

20. A non-transitory computer readable medium with computer executable instructions for identifying suspected capacitor degradation in a power system, the computer readable medium comprising computer executable instructions for:

computing an uncompensated negative sequence current value at least partially according to a plurality of current signals or values representing AC currents associated with the capacitors or filters of the power system;

compensating the uncompensated negative sequence current value at least partially according to a plurality of voltage signals or values representing AC voltages associated with the capacitors or filters to obtain a compensated negative sequence current value; and identifying suspected degradation of at least one capacitor of the power conversion system at least partially according to the compensated negative sequence current value.

21. The computer readable medium of claim 20, comprising computer executable instructions for:

computing a negative sequence voltage value at least partially according to the plurality of voltage signals or values; and computing the compensated negative sequence current value at least partially according to the uncompensated negative sequence current value and the negative sequence voltage value.

* * * * *